United States Patent [19]
Saito et al.

[11] Patent Number: 5,304,975
[45] Date of Patent: Apr. 19, 1994

[54] MAGNETORESISTANCE EFFECT ELEMENT AND MAGNETORESISTANCE EFFECT SENSOR

[75] Inventors: Yoshiaki Saito, Yokohama; Susumu Hashimoto, Ebina; Koichiro Inomata; Hitoshi Iwasaki, both of Yokohama; Reiko Kondoh, Yokohama; Junichi Akiyama, Kawasaki; Yuichi Ohsawa; Toshihiko Ohto, both of Yokohama, all of Japan

[73] Assignee: Kabushiki Kaisha Toshiba, Kawasaki, Japan

[21] Appl. No.: 965,073

[22] Filed: Oct. 22, 1992

[30] Foreign Application Priority Data

Oct. 23, 1991 [JP] Japan .................. 3-275231
Dec. 3, 1991 [JP] Japan .................. 3-318851
Jan. 27, 1992 [JP] Japan .................. 4-11573
Mar. 31, 1992 [JP] Japan .................. 4-76783

[51] Int. Cl.$^5$ .................. H01L 43/08; G01R 33/02
[52] U.S. Cl. .................. 338/32 R; 324/252; 360/113
[58] Field of Search .................. 338/32 R; 324/252; 360/113

[56] References Cited

U.S. PATENT DOCUMENTS

4,103,315 7/1978 Hempstead et al. .
5,134,533 7/1992 Friedrich et al. ............ 338/32 R X
5,206,590 4/1933 Dieny et al. .................. 324/252

FOREIGN PATENT DOCUMENTS

0406060 1/1991 European Pat. Off. .
0483373 5/1992 European Pat. Off. .

OTHER PUBLICATIONS

Parkin, et al., Appl. Phys. Lett. 58(23), Jun. 1991, pp. 2710-2712, "Giant magnetoresistance in antiferromagnetic Co/Cu multilayers".

J. Appl. Phys. vol. 58, No. 4, pp. 1667-1670, Aug. 15, 1985, M. Kitada, et al., "Magnetoresistive Thin-Film Sensor With Permanent Magnet Biasing Film".

IEEE Transactions on Magnetics, vol. 24, No. 6, pp. 2609-2611, Nov. 1988, W. C. Cain, et al., "Exchange Coupled NiFe-TbCo Thin Films for Use in Self-Biased Magnetoresistive Heads".

*Primary Examiner*—Marvin M. Lateef
*Attorney, Agent, or Firm*—Oblon, Spivak, McClelland, Maier & Neustadt

[57] ABSTRACT

A magnetoresistance effect element includes a multilayer obtained by stacking magnetic and nonmagnetic layers to exhibit a magnetoresistance effect, and an reversal assist layer formed on the multilayer to assist reversal of a magnetic moment of the magnetic layer.

21 Claims, 20 Drawing Sheets

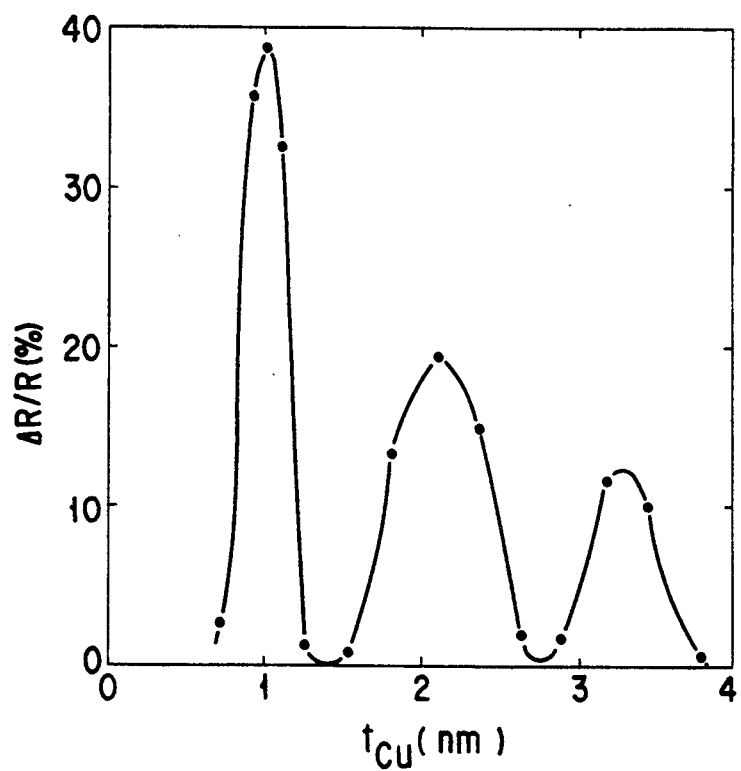
F I G. 1
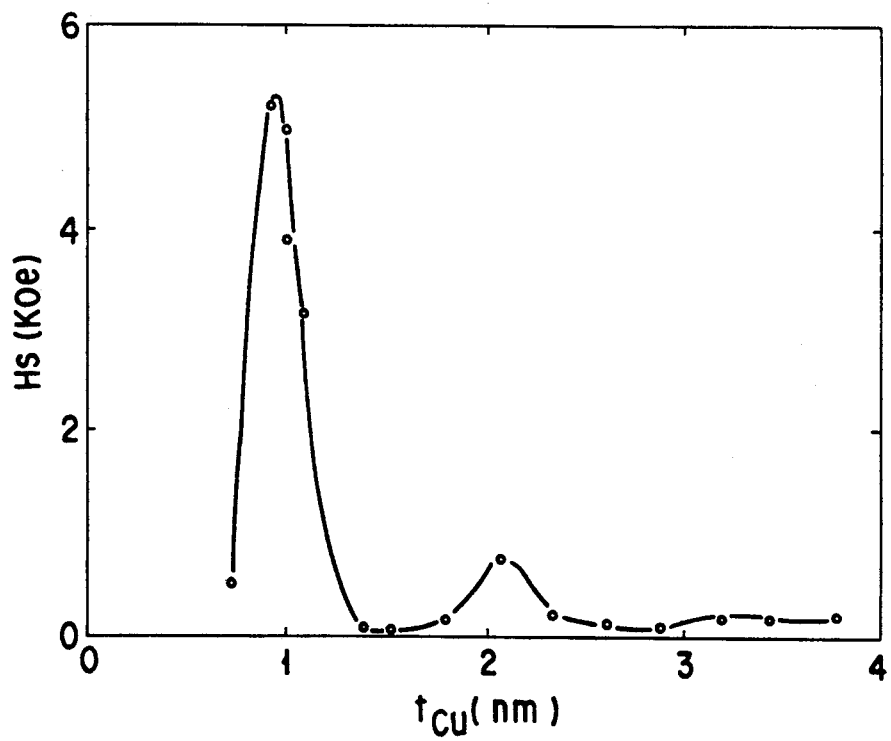
F I G. 2

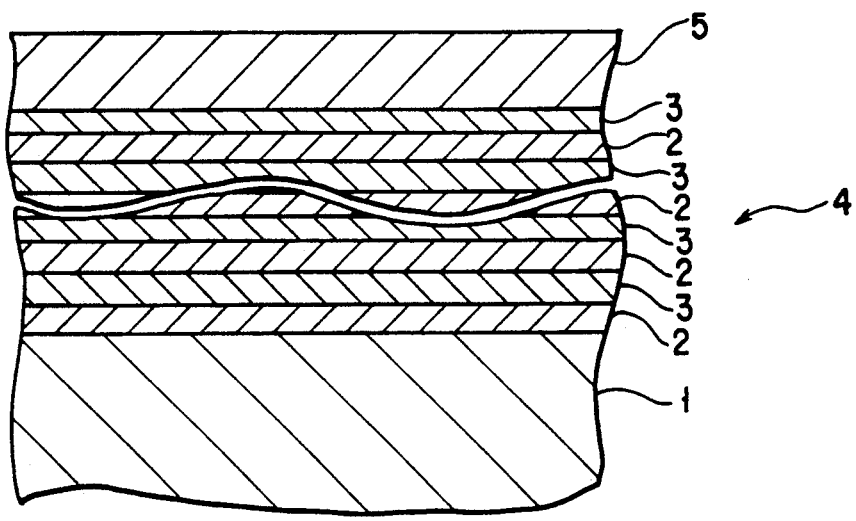
F I G. 3
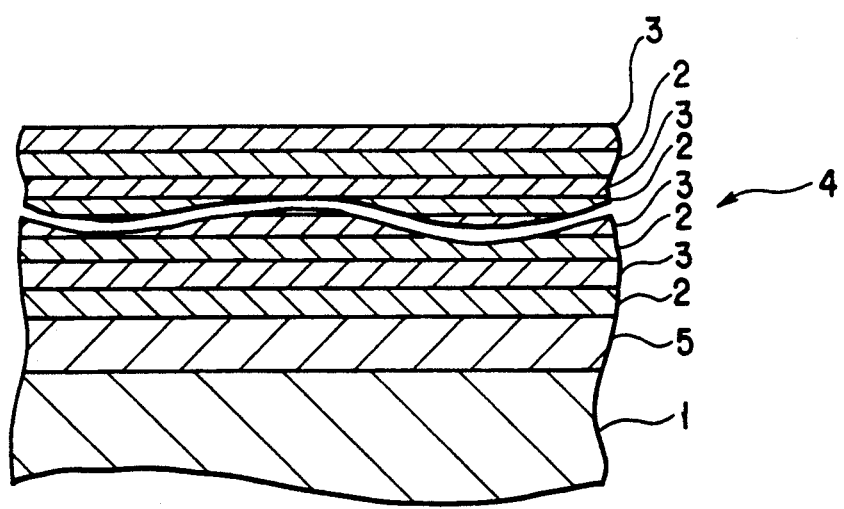
F I G. 4

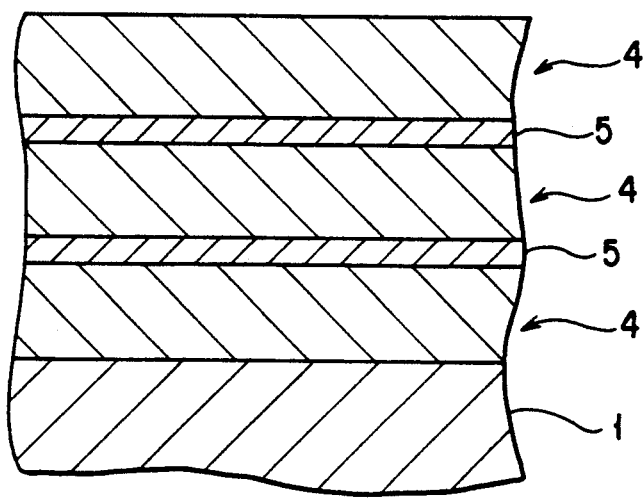
F I G. 5
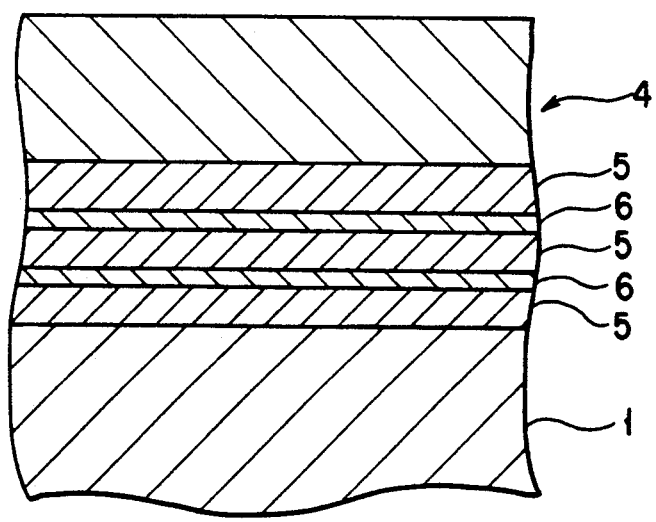
F I G. 6

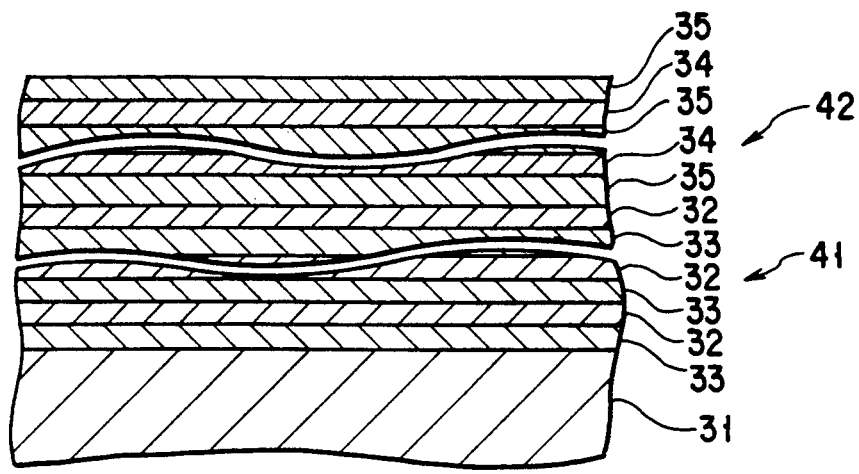
F I G. 8
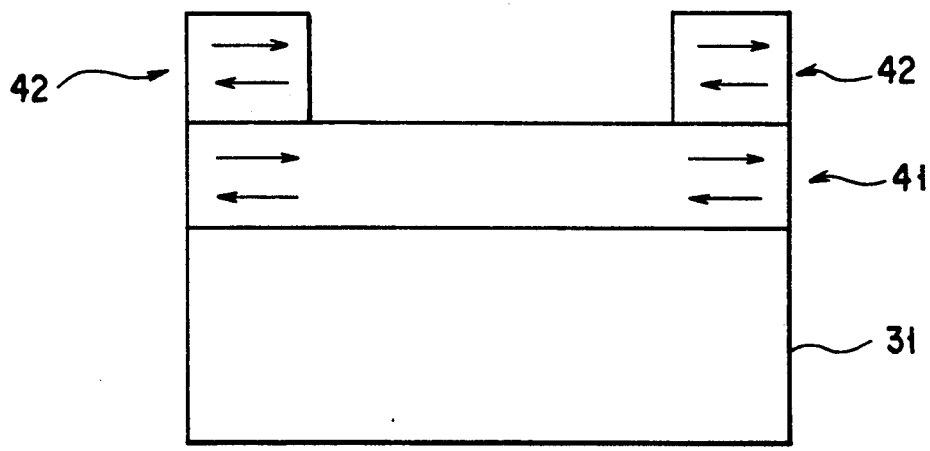
F I G. 9

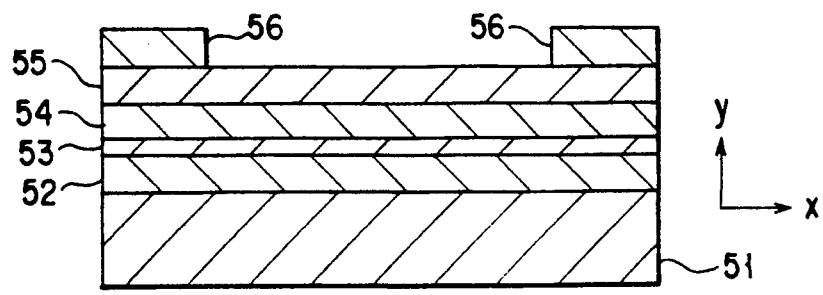
F I G. 10
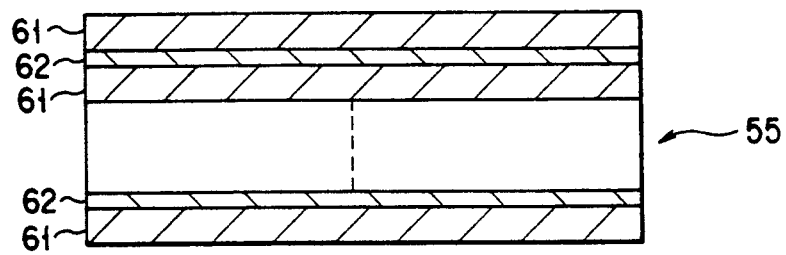
F I G. 11
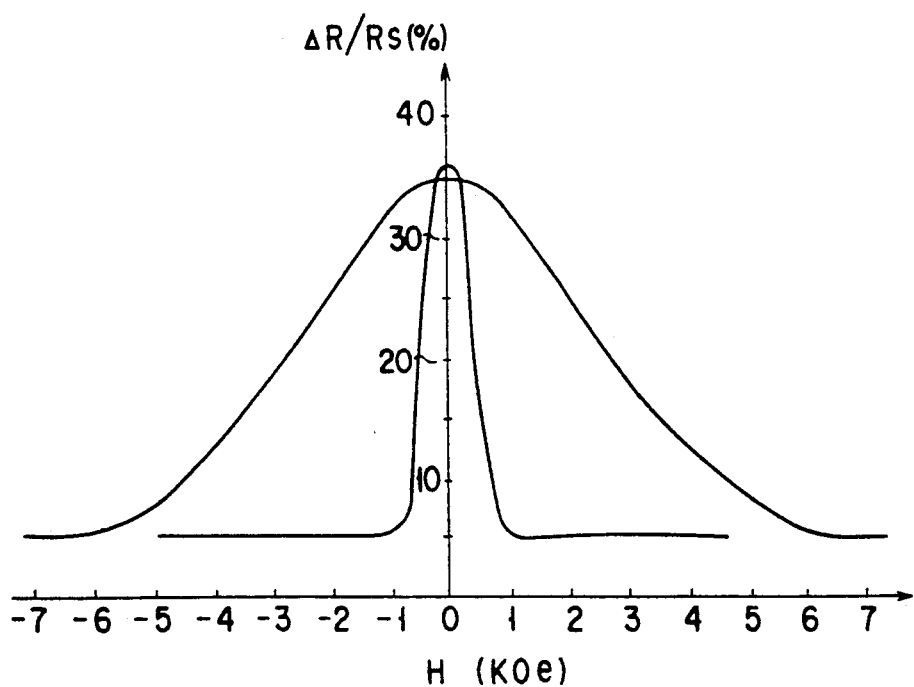
F I G. 12

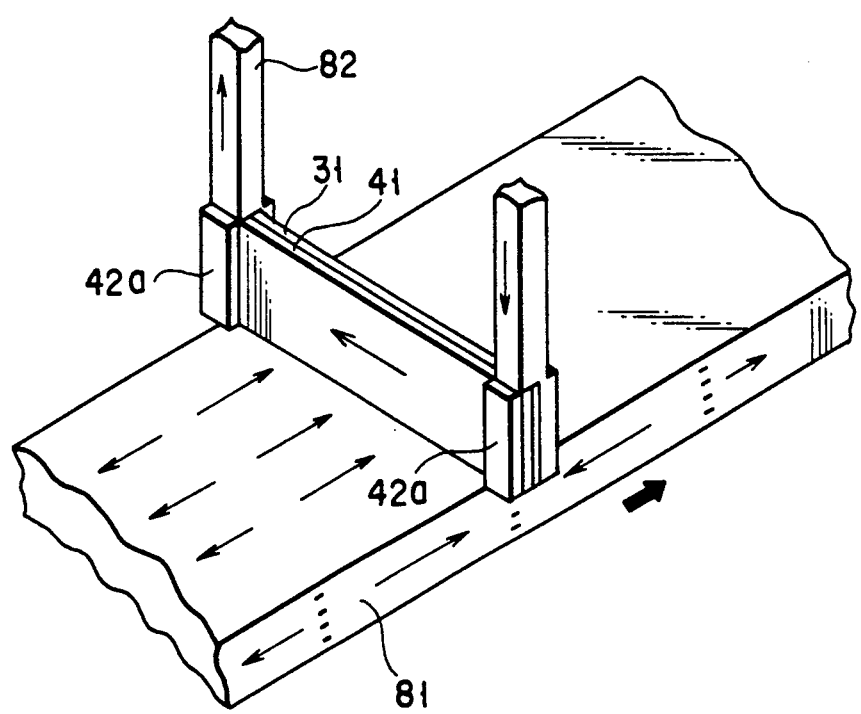
F I G. 19

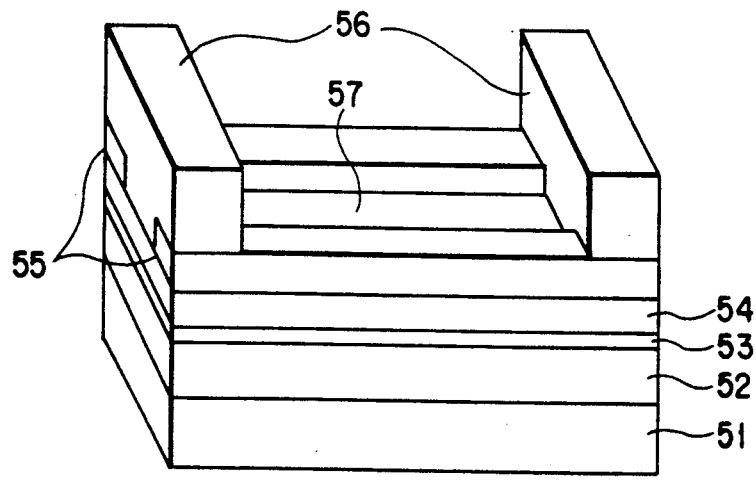
F I G. 22
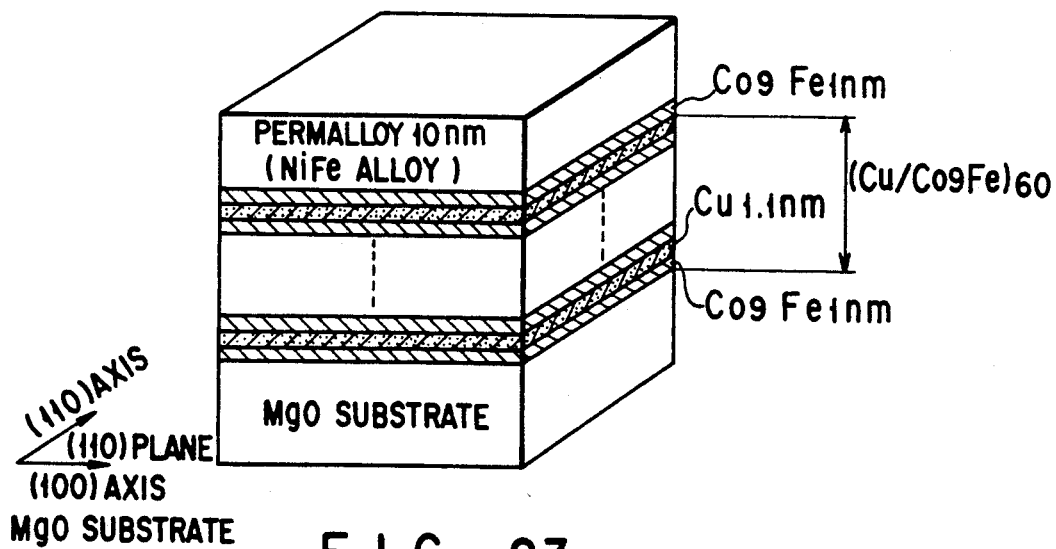
F I G. 23

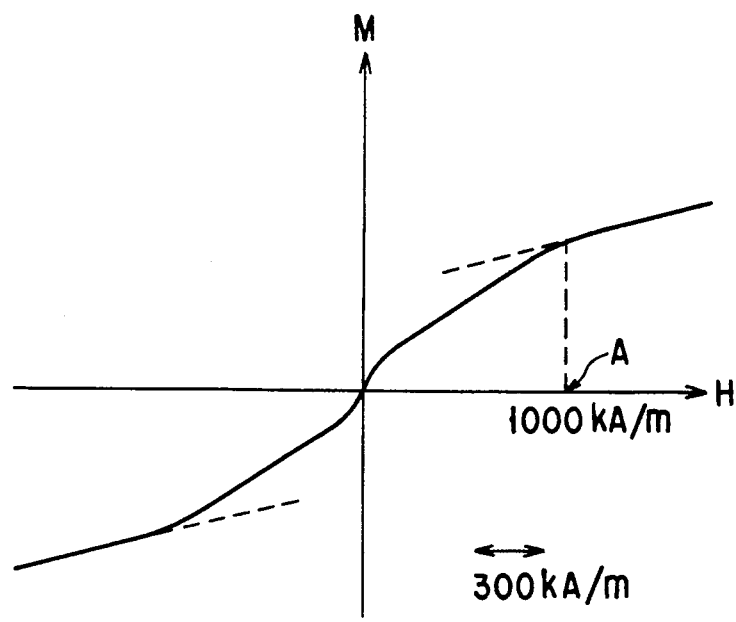
F I G. 25
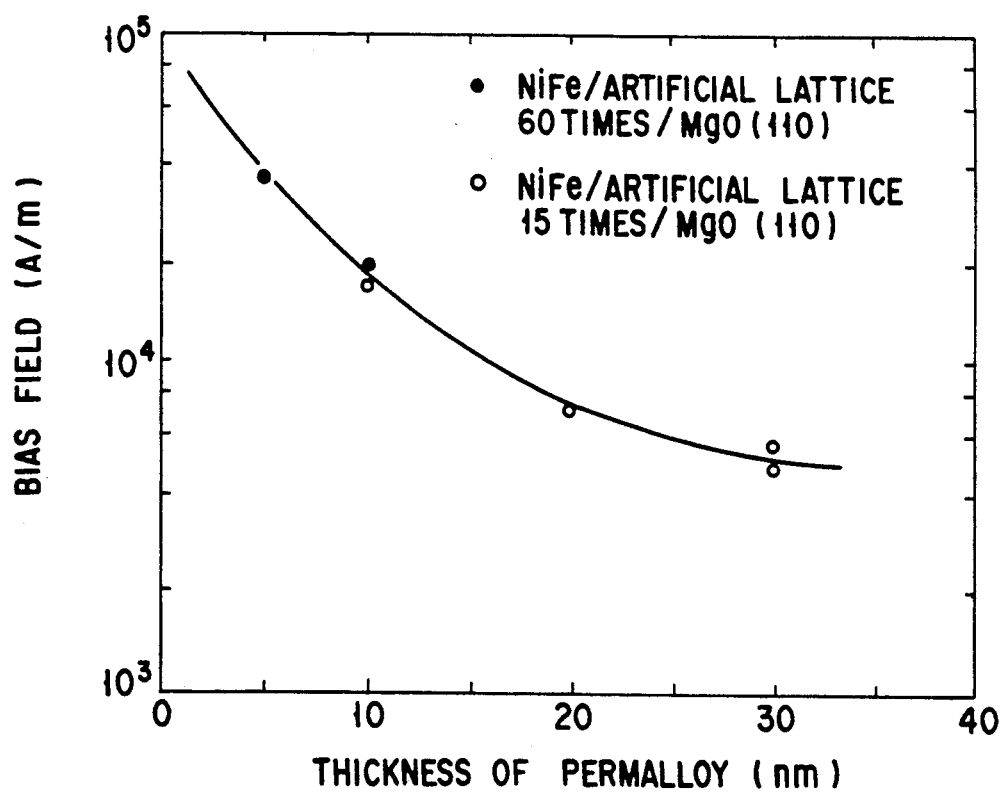
F I G. 26

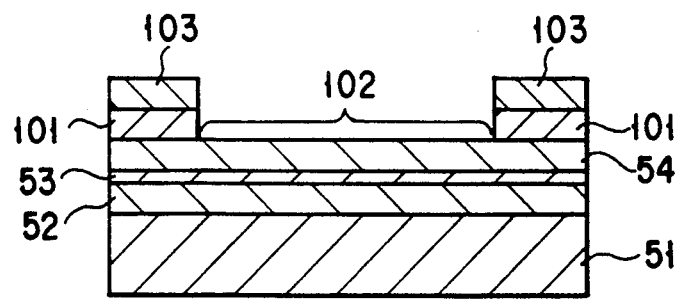
F I G. 27A
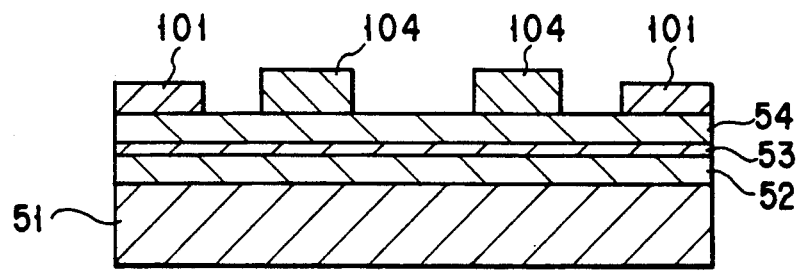
F I G. 27B
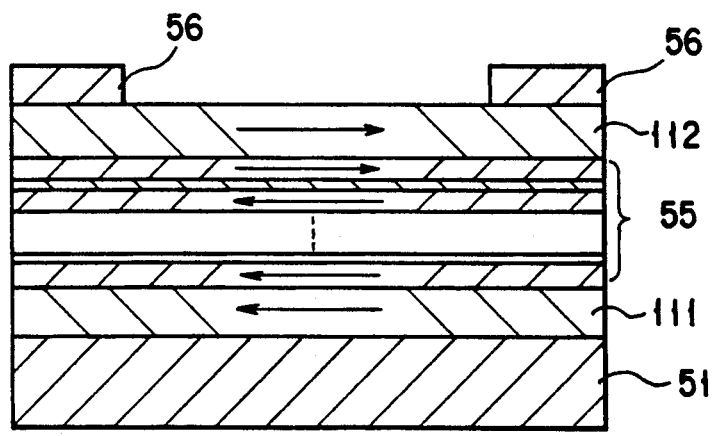
F I G. 28

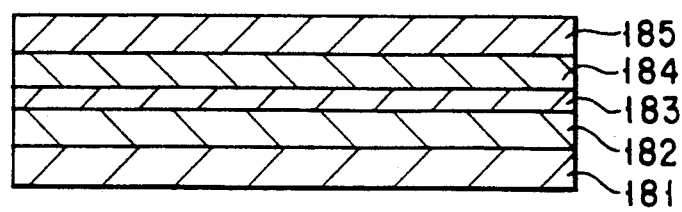
F I G. 35
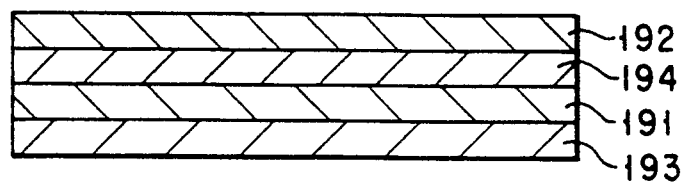
F I G. 36

MAGNETORESISTANCE EFFECT ELEMENT AND MAGNETORESISTANCE EFFECT SENSOR

BACKGROUND OF THE INVENTION

1. Field of the Invention

The present invention relates to a magnetoresistance effect element and a magnetoresistance effect sensor used in a magnetic field sensor, a magnetic head, and the like and, more particularly, to a magnetoresistance effect element and a magnetoresistance effect sensor utilizing an artificial lattice film.

2. Description of the Related Art

The magnetoresistance effect is an effect in which the resistance of an object is changed upon application of a magnetic field. Magnetoresistance effect elements that utilize this effect find a variety of applications including those for magnetic field sensors and magnetic heads because of their high sensitivity to magnetic fields and their ability to produce a relatively large output. While a Permalloy thin film is conventionally widely used for such magnetoresistance effect elements, the magnetoresistance ratio ($\Delta R/Rs$: where $\Delta R$ is a difference in electric resistance between the zero magnetic field and the saturated magnetic field; Rs is the electric resistance obtained when the saturation field is applied) of a Permalloy film is as low as about 2 to 3% and, therefore, does not show a satisfactory sensitivity to changes in the magnetic field.

On the other hand, as a new magnetoresistance effect element, a multilayer formed of alternately stacked magnetic and nonmagnetic layers each having a thickness of several to several tens of Angstroms or a so-called artificial lattice film has received a great deal of attention in recent years. Known types of the multilayers include $(Fe/Cr)_n$ (Phys. Ref. Lett. vol. 61(21) (1988)2472, $(Permalloy/Cu/Co/Cu)_n$ (J. Phys. Soc. Jap. vol. 59(9) (1990)3061), and $(Co/Cu)_n$ (J. Mag. Mag. Mat. 94(1991)L1; Phys. Rev. Lett. 66(1991)2152).

These multilayers exhibit a high magnetoresistance ratio as scores of %. In particular, when these multilayers are formed by using a film formation apparatus comprising an ultra-high vacuum system, e.g., an ultra-high vacuum (UHV) vapor deposition and a molecular beam epitaxy (MBE), a high magnetoresistance effect exceeding 20% can be obtained at room temperature. Accordingly, when these multilayers are used in the magnetoresistance effect heads, a large increase in output is expected.

However, a saturation field $H_S$ of the known multilayers are as strong as about 10 kOe in contrast to only several Oe for Permalloy. It follows that, where the known multilayers are used in a magnetic sensor or a magnetic head designed to detect a weak magnetic field, the magnetic sensor or head fails to exhibit a sufficient sensitivity.

More specifically, when an application as a magnetic sensor or a magnetic head is considered, it is desirable for the artificial lattice film to exhibit a large magnetoresistance change under a weak magnetic field. To this end, the saturation field $H_S$ of the artificial lattice film is required to be diminished.

However, an artificial lattice film meeting these particular requirements has not yet been developed.

It is proposed to use a magnetoresistance effect head utilizing the magnetoresistance effect described above to read data recorded on a magnetic recording medium (IEEE MAG-7, 150, (1971)). In recent years, as the size reduction and capacity increase of a magnetic recording medium have been in progress, the relative speed of the data reading magnetic head and the magnetic recording medium during data read has been decreased. Hence, a magnetoresistance effect head capable of obtaining a large output even at a low relative speed is expected.

When a magnetoresistance effect head is to be put into practical use, two types of bias magnetic fields must be applied to this head. One bias magnetic field is generally called a transverse bias to be applied in a direction perpendicular to the sense current of the magnetoresistance effect element. The transverse bias is a magnetic field which is applied until the magnitude of an external signal and that of a detection signal reach a proportional state, i.e., a so-called operating point. An example of a method of applying the transverse bias includes a self-bias scheme disclosed in Published Examined Japanese Patent Application Nos. 53-37205 and 56-40406 and the like and a shunt-bias scheme disclosed in Published Examined Japanese Patent Application No. 53-25646 and the like. According to the self-bias scheme, a soft adjacent layer is formed adjacent to a magnetoresistance effect film through a thin nonmagnetic film, and a magnetic field generated by the sense current is utilized as the transverse bias. A method of applying the transverse bias by flowing a current through a coil disposed adjacent to a magnetoresistance effect film is disclosed in Published Examined Japanese Patent Application No. 53-37206. A method of a hard magnetic film with a magnetization in one direction formed adjacent to a magnetoresistance effect film in order to apply the horizontal bias is disclosed in Published Examined Japanese Patent Application No. 54-8291 and the like.

The other bias magnetic field is generally called a longitudinal bias to be applied in a direction parallel to the sense current of the magnetoresistance effect element. The longitudinal bias suppresses Barkhausen noise which is caused since the magnetoresistance effect element has a large number of magnetic domains. In other words, the longitudinal bias serves to minimize the number of magnetic walls which cause noise generation.

Various methods have been conventionally proposed to apply the longitudinal bias. For example, U.S. Pat. No. 4,103,315 discloses that a uniform longitudinal bias is generated in a magnetoresistance effect film by exchange-coupling an antiferromagnetic film and a ferromagnetic film. According to JOURNAL OF APPLIED PHYSICS VOL. 52, 2472, (1981), when an FeMn alloy film is used as an antiferromagnetic film and a Permalloy ($Ni_{80}Fe_{20}$) film is used as a magnetoresistance effect film, a vertical bias is applied to the magnetoresistance effect film due to the magnetic exchange coupling of the alloy and Permally films. In any of these cases, the spin of the magnetoresistance effect film is fixed in one direction by the longitudinal bias to suppress the Barkhausen noise.

As another example of the method of applying the longitudinal bias, in addition to the methods described above, a method of using an one-direction magnetized ferromagnetic film in the same manner as that employed for applying the transverse bias is proposed. According to this method, the longitudinal bias, the transverse bias, and an intermediate bias of the two biases can be applied by selecting the direction of magnetization. Magnetic Recording Laboratory, MR-37, the Institute of Electronic and Communication Engineers of Japan introduces a method of applying the longitudinal bias by forming a CoP film at the end portion of a yoke type magnetoresistance effect film.

In this manner, various methods have been proposed to apply the longitudinal bias. When, however, these methods are applied to the magnetic head for hard disk drive, the following problems arise.

Of these methods of applying the longitudinal bias, one with which the most preferable characteristics can be expected in an application to the magnetic head for hard disk drive is a method of forming an FeMn alloy (γ-FeMn alloy) film as an antiferromagnetic film on a magnetoresistance effect film made of a Permalloy or the like.

The longitudinal bias magnetic field is desirably of 10 to 30 Oe.

However, the FeMn alloy seriously adversely affects the reliability of the magnetoresistance effect element, as is reported in Nippon Kinzoku Gakkai (Japanese Metal Society) (543), fall 1990, since Mn is easily oxidized. When an antiferromagnetic film is to be formed by sputtering a γ-FeMn alloy, an α-FeMn alloy phase is sometimes formed, as is pointed out in JOURNAL OF APPLIED PHYSICS VOL. 52, 2471, (1981), and it is difficult to obtain a stable γ-FeMn alloy phase in the industrial level.

Regarding the longitudinal bias to be applied, if it is weaker than the antimagnetic field at the edge portion of the magnetoresistance effect film, the magnetoresistance effect film fails to have a single magnetic domain; if it is weaker than this, the sensitivity of the magnetoresistance effect film is decreased. Hence, the longitudinal bias to be applied preferably has a strength to cancel the antimagnetic field at the edge portion of the magnetoresistance effect film. The strength of the antimagnetic field depends on the shape of the magnetoresistance effect element, i.e., the width and depth of the tracks, and the film thickness. Hence, the level of the exchange-coupling energy must be changed in accordance with the specifications of the magnetic head by controlling the shape of the magnetoresistance effect element. However, in order to control the exchange-coupling energy between the FeMn alloy as the antiferromagnetic film and the NiFe alloy as the magnetoresistance film, the thickness of the NiFe or FeMn alloy film must be changed, as described in the above JOURNAL OF APPLIED PHYSICS VOL. 52, 2471, (1981). When the thickness of the NiFe alloy film is changed, the characteristics of the magnetic head itself are changed. Thus, it is not preferable to arbitrarily change the thickness of the NiFe alloy film. When the thickness of the FeMn alloy film is increased, an α-FeMn alloy phase is formed in the film, which is similarly non-preferable. In this manner, it is actually very difficult to change the exchange-coupling energy in accordance with the specifications of the magnetic head.

Furthermore, as is pointed out in JOURNAL OF APPLIED PHYSICS VOL. 53, 2005, (1982), the exchange-coupling energy between the FeMn alloy and the NiFe alloy largely depends on the temperature, and the characteristics of the magnetoresistance effect element may be undesirably changed by the environmental conditions and heat generation by the sense current. In order to avoid these drawbacks, IEEE TRANS. MAG-24, 2609 (1988) discloses a method of exchange-coupling a TbCo alloy with an NiFe alloy. However, since the TbCo alloy is easily oxidized, long-term reliability is not guaranteed even if the environmental conditions where the alloy is to be used are limited.

The method of applying the longitudinal bias by the ferromagnetic body with a magnetization in one direction is effective if the magnetoresistance effect film is formed to be spaced apart from the magnetic recording medium, as in the yoke type magnetoresistance effect head. However, if the magnetoresistance effect film is formed close to the magnetic recording medium, as in the sealed type magnetoresistance effect head, the magnetic recording medium may undesirably be demagnetized by the leakage magnetic field from the ferromagnetic body. When the coercive force of the ferromagnetic member is decreased to avoid demagnetization, the direction of magnetization of the ferromagnetic body may undesirably be changed by the leakage magnetic field of the magnetic recording medium.

In this manner, the conventional methods of applying the longitudinal bias have various drawbacks when they are applied to a magnetic recording system in which a magnetoresistance effect film and a magnetic recording medium are adjacent to each other, as in a case wherein the magnetoresistance effect head for hard disk drive is used.

SUMMARY OF THE INVENTION

It is an object of the present invention to provide a magnetoresistance effect element having a weak saturation field and capable of obtaining a low magnetoresistance ratio with a weak magnetic field.

It is another object of the present invention to provide a magnetoresistance effect element capable of obtaining a high magnetoresistance ratio and decreasing the noise by suppressing generation of magnetic walls when the magnetoresistance effect element is applied to a magnetic sensor, e.g., a magnetic head.

It is still another object of the present invention to provide a highly sensitive magnetoresistance effect sensor producing little Barkhausen noise, in which a bias magnetic field can be applied to the magnetoresistance effect film without disturbing the bias magnetic field by the magnetic field of a magnetic recording medium or the like.

According to an aspect of the present invention, there is provided a magnetoresistance effect element comprising: a multilayer obtained by stacking magnetic and nonmagnetic layers to exhibit a magnetoresistance effect; and a reversal assist layer, formed in contact with the multilayer, to assist reversal of a magnetic moment of the magnetic layer.

According to another aspect of the present invention, there is provided a magnetoresistance effect element comprising: a first multilayer obtained by stacking magnetic and nonmagnetic layers to exhibit a magnetoresistance effect; and a second multilayer obtained by stacking magnetic and nonmagnetic layers to exhibit a saturation field larger than that of the first multilayer, wherein the second multilayer is formed on at least an end portion of the first multilayer to apply a bias magnetic field to the first multilayer.

According to still another aspect of the present invention, there is provided a magnetoresistance effect sensor comprising: a substrate; a magnetoresistance effect layer having a magnetoresistance effect; a bias applying layer which is obtained by stacking magnetic and nonmagnetic layers and in which two magnetic layers adjacent to each other with one of the nonmagnetic layers interposed therebetween are antiferromagnetically coupled to apply a bias to the magnetoresistance effect layer; and a conductive layer formed on the magnetoresistance effect layer or the bias applying layer, wherein the sensor detects a magnetic field from a change in electric resistance of the magnetoresistance effect layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a graph showing the relationship between the thickness of the nonmagnetic layer and the magnetoresistance ratio;

FIG. 2 is a graph showing the relationship between the thickness of the nonmagnetic layer and the saturation field;

FIGS. 3 to 6 are sectional views showing magnetoresistance effect elements according to the first embodiment of the present invention;

FIGS. 8 and 9 are sectional views showing magnetoresistance effect elements according to the second embodiment of the present invention;

FIG. 10 is a sectional view showing an arrangement of a magnetoresistance effect sensor according to the third embodiment of the present invention;

FIG. 11 is a sectional view showing the structure of a bias applying layer of the magnetoresistance effect sensor of FIG. 10;

FIG. 12 is a graph showing the relationship between the external magnetic fields and the magnetoresistance ratios of Example 1 together with that of Comparative Example 1;

FIG. 19 is a perspective view showing a magnetoresistance effect head using a magnetoresistance effect element prepared in Example 6.

FIG. 22 is a perspective view showing a magnetoresistance effect sensor in which a magnetic anisotropy is imparted to the magnetoresistance effect layer;

FIG. 23 is a sectional view showing another magnetoresistance effect sensor in which a magnetic anisotropy is imparted to the magnetoresistance effect layer;

FIG. 25 is a graph showing a magnetization curve of the magnetoresistance effect sensor shown in FIG. 23 obtained by measurement in the (110)-axial direction of the MgO substrate;

FIG. 26 shows the relationship between the NiFe film thickness and the bias magnetic field characteristics obtained when the numbers of stacked layers are 60 and 15;

FIGS. 27A and 27B are views showing other arrangements of the magnetoresistance effect sensor according to the third embodiment of the present invention;

FIG. 28 is a sectional view showing a magnetoresistance effect sensor in which the magnetic field generated by the sense current is applied as the horizontal bias;

FIGS. 35 and 36 show still other arrangements of the magnetoresistance effect sensor according to the third embodiment of the present invention.

DETAILED DESCRIPTION OF THE PREFERRED EMBODIMENTS

Figure 7:
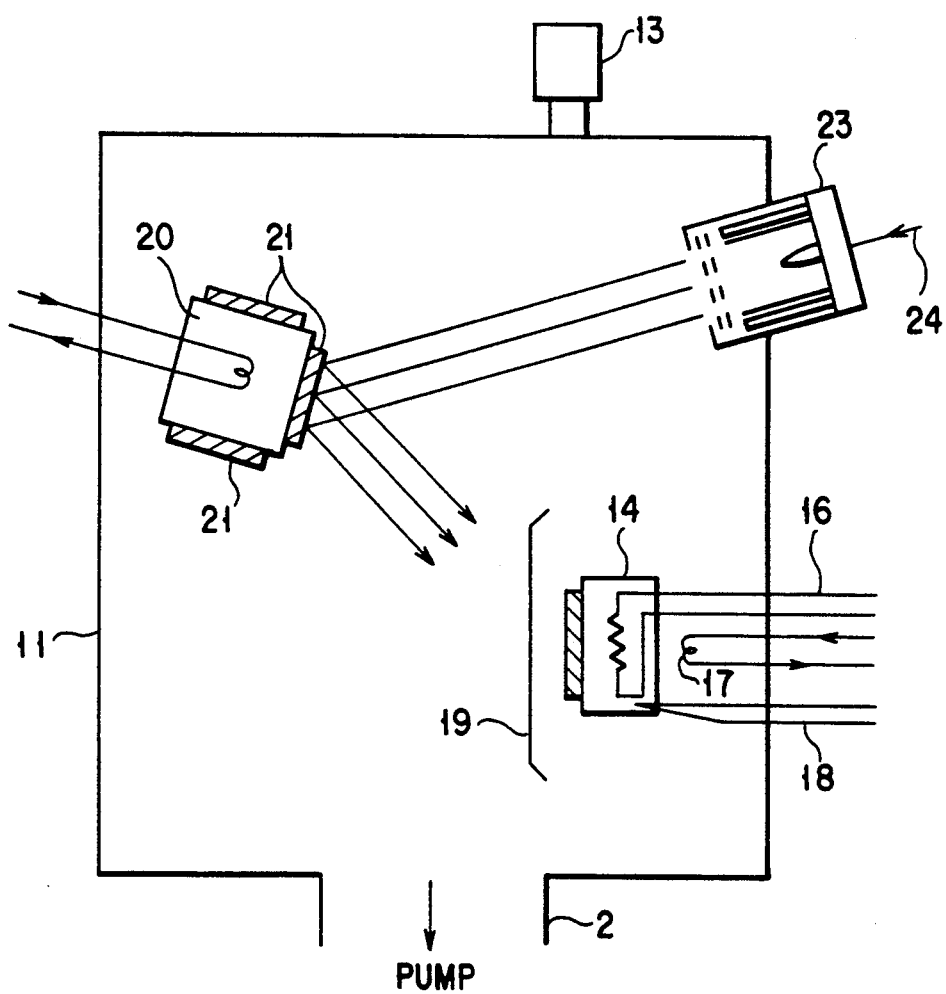
FIG. 7 shows a film forming apparatus used in the present invention.

The preferred embodiments of the present invention will be described with reference to the accompanying drawings.

According to the first embodiment of the present invention, there is provided a magnetoresistance effect element comprising: a multilayer obtained by stacking magnetic and nonmagnetic layers to exhibit a magnetoresistance effect; and a reversal assist layer, formed in contact with the multilayer, to assist reversal of a magnetic moment of the magnetic layer.

The present inventors have made extensive studies on a magnetoresistance effect element with which a high magnetoresistance ratio can be obtained with a weak magnetic field, and have found the fact that a saturation field can be decreased, while maintaining a sufficiently high magnetoresistance ratio, by forming, on a multilayer obtained by stacking magnetic and nonmagnetic layers to exhibit a magnetoresistance effect, a reversal assist layer for assisting reversal of the magnetic moment of the magnetic layer. That is, since the magnetic moment of the magnetic layer constituting the multilayer becomes to be reversed easily due to the presence of the reversal assist layer, the magnetic moment of the magnetic layer can be reversed with a weak magnetic field while maintaining the high magnetoresistance ratio by the multilayer. Hence, a high sensitivity can be obtained. This embodiment is based on these findings of the present inventors.

The magnetic layer constituting the multilayer is formed of, e.g., a transition metal such as Fe, Co, or Ni, or alloys containing at least one of such transition metals. More specifically, $Fe_xCo_{1-x}$, $Ni_xFe_{1-x}$, $Ni_xCo_{1-x}$ or $Ni_x(Fe_yCo_{1-y})_{1-x}$ alloys are preferable. It is preferable that two magnetic layers that are adjacent each other with one of the nonmagnetic layers interposed therebetween are antiferromagnetically coupled to each other while no magnetic field is substantially applied. Antiferromagnetic coupling means that two magnetic layers that are adjacent each other with one of nonmagnetic layers interposed therebetween are coupled to each other such that their magnetic moments are in the opposite directions. With this coupling, the magnetoresistance ratio can be increased. When the antiferromagnetic coupling force is small, the saturation field $H_S$ can be diminished, and the resultant magnetoresistance effect element is suitable as an application including a magnetic head. The thickness of the magnetic layer is preferably 0.1 nm to 10 nm. If the thickness of the magnetic layer falls outside this range, the magnetoresistance ratio tends to be decreased. A further preferable film thickness is 0.5 nm to 7 nm. The film thicknesses and compositions of the respective magnetic layers need not be the same.

The material of the nonmagnetic layer is not particularly restricted as far as it is nonmagnetic and it exhibits a good magnetoresistance effect. For example, a metal such as Cr, Ru, Cu, Al, Ag, or Au, or an alloy containing such a metal can be used. The film thickness of the nonmagnetic layer is preferably 0.5 nm to 10 nm. If the film thickness of the nonmagnetic layer falls outside this range, the magnetoresistance ratio is decreased. A further preferable film thickness is 0.7 nm to 7 nm. The film thicknesses and compositions of the respective nonmagnetic layers need not be the same.

The thickness and the magnetoresistance ratio of the nonmagnetic layer satisfy the relation as shown in FIG. 1. Since the magnetoresistance ratio oscillates with respect to the thickness of the nonmagnetic layer, it is preferable that the thickness of the nonmagnetic layer is determined within the range described above to obtain a high magnetoresistance ratio. As shown in FIG. 2, the saturation field also oscillates with respect to the thickness of the nonmagnetic layer, and the peak position of the saturation field overlaps the peak position of the magnetoresistance ratio. Accordingly, it is preferable that the thickness of the nonmagnetic layer is determined to balance the magnetoresistance ratio and the saturation field in accordance with the applications. Note that FIGS. 1 and 2 are graphs obtained at room temperature by measuring a multilayer obtained by stacking 16 pairs of magnetic and nonmagnetic layers by using an $Fe_{0.1}Co_{0.9}$ layer having a thickness of 1 nm as each magnetic layer and a Cu layer having a thickness of 1 nm as each nonmagnetic layer.

The multilayer is formed by stacking these magnetic and nonmagnetic layers.

The reversal assist layers have a function of assisting reversal of the magnetic moment of the magnetic layers constituting the multilayer. In order to exhibit this function, the reversal assist layer may be formed of a magnetic material having a softer magnetism than that of the multilayer. The reversal assist layer can exhibit above function when it is formed of a magnetic material having a softer magnetism than that of the magnetic layer having the hardest magnetism. To have the soft magnetism means that the direction of the magnetic moment can be easily reversed, and the soft magnetism can be represented by, e.g., a coercive force (Hc). That is, the smaller the Hc, the softer the magnetism. It is assumed that when the reversal assist layer is formed of such a soft magnetic material that can be easily reversed, the magnetic moment in the magnetic layer is easily reversed by the mutual function of the reversal assist layer and the magnetic layer. Examples of the material constituting the reversal assist layer are a transition metal such as Fe, Co, or Ni, and an alloy containing such a transition metal, and a material exhibiting a soft magnetism, e.g., a conventional soft magnetic material such as Permally, Supermalloy, or Sendust is preferable. The film thickness of the reversal assist layer is preferably about 0.5 nm to 100 nm, and more preferably 0.5 nm to 20 nm. In order to perform such a function as a reversal assist layer, the reversal assist layer may be made of a material having a soft magnetism, or the magnetism of the reversal assist layer may be set soft by increasing the film thickness. That is, even if the same material as that of the magnetic layer is used, the reversal assist function can be performed if the thicknesses of the reversal assist layers are larger than that of the magnetic layers. Naturally, the film thickness may be increased as compared to that of the magnetic layer while using a material having a soft magnetism. Occasionally, a reversal assist layer preferably has a high electric resistance. Then, a large quantity of current can be supplied to the multilayer having the magnetoresistance effect.

The multilayer and the reversal assist layer having the magnetoresistance effect as described above are generally supported on a substrate. In this case, the material of the substrate is not particularly limited. Examples of the material constituting the substrate are MgO, Cr, GdAs, Si, Cu, Fe, Co, Ni, LiF, and $CaF_2$.

In this embodiment, reversal assist layers are stacked on a multilayer basically having the above-described magnetoresistance effect to form an element. At this time, the number of multilayers may be one or more. A multilayer or multilayers may be formed after a reversal assist layer or layers are formed. Furthermore, reversal assist layers may be formed between a plurality of multilayers, or between every two adjacent magnetic layers.

The reversal assist layer can be disposed on an outerend portion of the multilayer and can contact to the magnetic layer of the multilayer. Also, the reversal assist layer can be interposed between the substrate and the multilayer, and can contact to the nonmagnetic layer of the multilayer.

The number of reversal assist layers may be one or more. For example, a plurality of reversal assist layers may be stacked with nonmagnetic layers interposed therebetween, and a multilayer having the above magnetoresistance effect may be stacked on the reversal assist layers.

At least one of the reversal assist layers can be interposed between two of the magnetic layers, the magnetic layer and the nonmagnetic layer, or two of the nonmagnetic layers of the multilayer.

For example, when a state wherein m or n (m≠n) magnetic layers M each having a film thickness tM and m or n nonmagnetic layers N each having a film thickness tN are alternately stacked to form a multilayer is represented as $(tMM/tNN)_n$, $(tNN/tMM)_n$, $(tMM/tNN)_m$, or $(tNN/tMM)_m$, a state wherein l (l is an integer more than 1) multilayers and l reversal assist layers M' each having a film thickness of tM' are alternately stacked is represented as $[tM'M'/(tMM/tNN)_n]_l$, $[tM'M/tNN/(tMM/tNN)_n]_l$, $[(tMM/tNN)_n/tM'M']_l$, $[(tMM/tNN)_n/tMM/tM'M']_l$, $[tM'M/(tNN/tMM)_n]_l$, $[tM'M/(tNN/tMM/tMM)_n]_l$, $[(tNN/tMM)_n/tM'M]_l$, or $[(tNN/tMM)_n/tNN/tM'M]_l$, $[(tNN/tMM)_m/tM'M/(tNN/tMM)_n]_l$. Any of the cases described above, it is preferable that the reversal assist layer or layers made of the soft magnetic material and one or two magnetic layers in the multilayer contact each other.

The practical structure of the magnetoresistance effect element of this embodiment will be described. FIG. 3 shows an arrangement in which a multilayer 4 obtained by alternately stacking magnetic and nonmagnetic layers 2 and 3 is formed on a substrate 1, and a reversal assist layer 5 is formed on the multilayer 4.

FIG. 4 shows an arrangement in which a reversal inversion assist layer 5 is formed on a substrate 1, and a multilayer 4 is formed on the reversal assist layer 5.

FIG. 5 shows an arrangement having a plurality of multilayers 4, in which reversal assist layers 5 are present between the respective multilayers 4.

FIG. 6 shows an arrangement in which a plurality of inversion assist layers 5 are stacked on a substrate 1 with nonmagnetic layers 6 interposed therebetween, and a multilayer 4 is formed on the uppermost inversion assist layer 5.

A magnetoresistance effect element having an arrangement as described above is formed in accordance with an ordinary thin film forming method, e.g., vapor deposition, sputtering, or molecular beam epitaxy (MBE). Film formation or annealing may be performed in a magnetic field to decrease the saturation field.

FIG. 7 shows an ion beam sputtering system as an example of a film forming system. An exhaust port 12 of a chamber 11 is connected to a vacuum pump (not shown), and the pressure in the chamber 11 is measured by a pressure gauge 13. A substrate holder 14 is placed in the chamber 11, and a substrate 15 is held by the substrate holder 14. A heater 16 is provided to the substrate holder 14. Cooling water 17 flows near the substrate holder 14 to adjust the temperature of the substrate holder 14 and the substrate 15. The temperature of the substrate holder 14 is measured by a thermocouple 18. A shutter 19 is provided in front of the substrate 15. A target holder 20 is rotatably provided at a position opposing the substrate 15, and a plurality of targets 21 are mounted on the surface of the target holder 20. The target holder 20 is cooled by cooling water 22. An ion gun 23 is provided at a position opposing the targets 21, and Ar gas 24 is supplied to the ion gun 23.

With this arrangement, ions from the ion gun 23 are projected toward the targets 21. Then, the targets 21 are sputtered and the elements constituting the targets 21 are deposited on the substrate 15.

The second embodiment of the present invention will be described.

According to the second embodiment of the present invention, there is provided a magnetoresistance effect element comprising a first multilayer obtained by stacking magnetic and nonmagnetic layers to exhibit a magnetoresistance effect, and a second multilayer obtained by stacking magnetic and nonmagnetic layers to exhibit a saturation field stronger than that of the first multilayer, wherein the second multilayer is formed on at least an end portion of the first multilayer to apply a bias magnetic field to the first multilayer.

In this embodiment, the first multilayer mainly bears the magnetoresistance effect and will be referred to as the MR portion hereinafter. The second multilayer replaces a conventional FeMn layer and will be referred to as the magnetization stabilization portion hereinafter.

Since the MR portion has a weak saturation field, it can change the magnetization state in response to a weak magnetic field from a recording medium. As a result, the MR portion can easily cause a change in resistance in accordance with the magnetic field. The magnetization stabilization portion is formed at least at the end portion of the MR portion. Since the saturation field of the magnetization stabilization portion is stronger than that of the MR portion, the magnetization state of the magnetization stabilization portion cannot be easily changed by an external magnetic field. Accordingly, when a bias magnetic field is applied to the MR portion by the magnetization stabilization portion, the magnetic layer of the magnetization stabilization portion and the magnetic layer of the MR portion are magnetically coupled so that magnetic walls will not be easily generated in the MR portions, thereby providing a low-noise magnetoresistance effect head.

For example, a so-called artificial lattice film formed by stacking, e.g., a magnetic layer having a thickness of 0.5 nm to 5 nm and a nonmagnetic layer having a thickness of 0.5 nm to 10 nm is used in the MR portion or in the magnetization stabilization portion. The magnetic layers of the MR portion and the magnetization stabilization portion may be formed of Fe, Co, or Ni, or alloys containing at least one of such elements. The nonmagnetic layers of the MR portion and the magnetization stabilization portion may be formed of Cr, Ru, Cu, Al, or Au, or alloys containing at least one of such elements. As the MR portion, a $(Co/Cu)_n$, $(Co-Fe/Cu)_n$, $(Permalloy/Cu/Permalloy)_n$, or $(Permalloy/Co/Cu)_n$ multilayer can be used. As the magnetization stabilization film, an $(Fe/Cr)_n$, $(Fe/Ru)_n$, or $(Co/Cu)_n$ multilayer film can be used.

The value of the saturation field can be changed by changing the thickness of the nonmagnetic layers, e.g., the Cu layers, of the MR portion or the magnetization stabilization portion. Thus, a multilayer including nonmagnetic layers having different film thicknesses may be commonly selectively used as both the MR portion and the magnetization stabilization portion. In this case, of the multilayer, nonmagnetic layers having a smaller film thickness are preferably used as the magnetization stabilization portion, and nonmagnetic layers having a larger film thickness are preferably used as the MR portion. Furthermore, the saturation field of multilayer can be decreased by imparting a magnetic anisotropy to the magnetic layer of multilayer. Thus, a multilayer having a magnetic layer imparted with the magnetic anisotropy may be used as the MR portion, and a multilayer not imparted with the anisotropy and having a large saturation field may be used as the magnetization stabilization portion. It is effective if a ratio $H_{S1}/H_{S2}$ of the saturation field $H_{S1}$ of the MR portion to the saturation field $H_{S2}$ of the magnetization stabilization portion satisfies $H_{S1}/H_{S2} \geq 1/5$.

The magnetization stabilization portion and the MR portion are magnetically coupled to each other so that a bias magnetic field is applied from the magnetization stabilization portion to the MR portion. That is, it suffices if the magnetization stabilization portion and the MR portion are so coupled as to be magnetically influenced. In this case, it is preferable that they are magnetically coupled with a nonmagnetic layer interposed therebetween because the coupling strength is increased. The bias magnetic field to be applied to the MR portion is preferably a vertical magnetic field. Furthermore, magnetization stabilization portions are preferably formed only at two end portions of the MR portion. The magnetization stabilization portions suffice if they can apply a strong bias magnetic field to the MR portion and need not have a magnetoresistance effect.

In this embodiment as well, the respective multilayers are supported on a substrate. In this case, the material of each substrate is not particularly limited, as in the first embodiment, and MgO, Cr, GdAs, Si, Cu, Fe, Co, Ni, LiF, $CaF_2$, or the like can be used as the material of the substrate.

The practical structure of the magnetoresistance effect element according to the second embodiment will be described. A first multilayer 41 obtained by alternately stacking magnetic and nonmagnetic layers 32 and 33 is formed on a substrate 31. A second multilayer 42 obtained by alternately stacking magnetic and nonmagnetic layers 34 and 35 is formed on the first multilayer 41 to obtain the structure as shown in FIG. 8. Then, the second multilayer 42 is micropatterned to form a magnetoresistance effect element as shown in FIG. 9 in which second multilayers 42a are formed only on the end portions of the first multilayer 41. Referring to FIG. 9, arrows in the respective multilayers represent the direction of the spin of the magnetic layer.

In this embodiment, each multilayer can be formed easily in accordance with RF magnetron sputtering, ion beam sputtering, vapor deposition, or the like as well as MBE and ultra-high vacuum sputtering.

The magnetoresistance effect element obtained in this manner can be used in a magnetoresistance effect head, a magnetic sensor, or the like.

The third embodiment of the present invention will now be described.

According to the third embodiment of the present invention, there is provided a magnetoresistance effect sensor comprising a substrate, a magnetoresistance effect layer having a magnetoresistance effect, a bias applying layer which is obtained by stacking magnetic and nonmagnetic layers and in which two magnetic layers that are adjacent each other with one nonmagnetic layer interposed therebetween are antiferromagnetically coupled to apply a bias to the magnetoresistance effect layer, and a conductive layer formed on the magnetoresistance effect layer or the bias applying layer, wherein the sensor detects a magnetic field from a change in electric resistance of the magnetoresistance effect layer.

In the magnetoresistance effect sensor according to the third embodiment, the bias applying layer is a multilayer film obtained by stacking the magnetic and nonmagnetic layers, the unit magnetic layer is remarkably thin, and the magnetic layers adjacent through one nonmagnetic layer are antiferromagnetically coupled. Thus, leakage magnetic field to the outside is very small as compared to that occurring with a conventional hard magnetic film bias.

The magnetoresistance effect layer contacts the bias applying layer formed of the multilayer, and the magnetoresistance effect film and the bias applying layer are exchange-coupled. Hence, a predetermined bias magnetic field can be applied to the magnetoresistance effect layer from the bias applying layer. At this time, the value of the bias magnetic field can be controlled by the exchange coupling force. The exchange coupling force can be controlled over a wide range up to several hundred times in accordance with the thickness and type of each nonmagnetic layer of the multilayer. As a result, the predetermined bias magnetic field according to the specifications of a required magnetoresistance effect sensor can be easily applied.

The material of the substrate is not particularly limited, and $Al_2O_3$-$TiO_2$-based ceramics can be suitably used.

As the material of the magnetoresistance effect layer, a material having a high magnetoresistance effect, e.g., an NiFe alloy such as an $Ni_{80}Fe_{20}$ alloy (Permalloy), an NiCo alloy, and the like can be used. The multilayer as described above may be used as the magnetoresistance effect layer.

As the material of magnetic layer of the bias applying layer, transition metal or an alloy containing such metal, for example, Co, Fe, or a CoFe alloy can be used. The thickness of the magnetic layer is preferably 0.3 nm to 10 nm. If the thickness of the magnetic layer is less than 0.3 nm, antiferromagnetic coupling between adjacent magnetic layers is decreased; if the thickness of the magnetic layer exceeds 10 nm, a magnetostatic energy from each magnetic layer is increased, and the thickness of the entire multilayer is increased.

As the material of the nonmagnetic layer of the bias applying layer, at least one element selected from the group consisting of Cu, Ru, Cr, Rh, Re, V, W, Mo, Ta, and Nb can be used. The thickness of the nonmagnetic layer is preferably 0.5 nm to 10 nm. If the thickness of the nonmagnetic layer falls outside this range, antiferromagnetic coupling between adjacent magnetic layers is decreased.

Antiferromagnetic coupling means that two magnetic layers that are adjacent each other with a nonmagnetic layer interposed therebetween are coupled to each other such that their magnetic moments are in the opposite directions. Both exchange coupling and magnetostatic coupling are acceptable.

In the bias applying layer, if Co is used as the material of the magnetic layer and if Ru, a CuNi alloy, or the like is used as the material of the nonmagnetic layer, the resultant magnetoresistance effect sensor exhibits an excellent corrosion resistance as compared to that using an antiferromagnetic member made of an FeMn alloy or the like.

In the bias applying layer, the strength of the bias magnetic field to be applied to the magnetoresistance effect layer and the saturation field $H_S$ representing the stability of the bias applying layer as a whole in the magnetizing direction can be separately controlled by changing the thickness of the nonmagnetic layer closest to the magnetoresistance effect layer and the thicknesses of other nonmagnetic layers, and by utilizing the magnetic anisotropy, e.g., crystal magnetic anisotropy. For example, the strength of the bias magnetic field to the magnetoresistance effect layer can be controlled while maintaining a remarkably strong saturation field $H_S$ of as high as 500 to 1,000 kA/m. As a result, the characteristics of the bias applying layer can be prevented from being disturbed by the magnetic field from the magnetic recording medium.

The conductive layer is formed on the magnetoresistance effect layer or the bias applying layer, and Cu or the like can be used as the material of the conductive layer.

The bias applying layer can be formed by a thin-film forming technique, e.g., ultra-high vacuum sputtering, ion beam sputtering, or the like, in the same manner as the artificial lattice films of the first and second embodiments.

As the longitudinal bias to be applied to the magnetoresistance effect layer, a conventionally used shunt bias, soft magnetic film bias, or two-layer magnetoresistance film bias can be used.

The number of magnetic layers to be alternated with the nonmagnetic layers in the bias applying layer must be two or more. The number of magnetic layers may be equal or not equal to the number of nonmagnetic layers. When they are not equal, e.g., when the number of magnetic layer is an even number and the number of nonmagnetic layers is an odd number, the uppermost and lowermost layers of the artificial lattice film can be set anti-parallel to each other. At this time, if the magnetic layer of the bias applying layer contacts the magnetoresistance effect layer, they are ferromagnetically exchange-coupled. If the nonmagnetic layer of the bias applying layer contacts the magnetoresistance effect layer, they are magnetostatically coupled. In either case, an effective bias magnetic field is applied to the magnetoresistance effect layer to set the magnetoresistance effect layer to include a single magnetic domain.

When bias applying layers are formed only on the two end portions of the magnetoresistance effect layer, the vertical bias magnetic field need not be strictly adjusted, thus simplifying the element.

The particle structure of the magnetoresistance effect sensor of this embodiment will be described. FIG. 10 shows an arrangement of a sensor of this embodiment. In FIG. 10, reference numeral 51 denotes a substrate. Shunt bias layers 52 and 53, magnetoresistance layer 54, a bias applying layer 55 and a conductive layer 56 are formed on the substrate 51, in this order. The bias applying layer 55 has an artificial lattice film structure in which magnetic and nonmagnetic layers 61 and 62 are alternately stacked, as shown in FIG. 11.

EXAMPLES

Examples of the first to third embodiments of the present invention will be described. Note that Examples 1 to 6 concern the first embodiment, that Example concerns the second embodiment, and that Example 8 concerns the third embodiment.

EXAMPLE 1

Using the ion beam sputtering system shown in FIG. 7 described above, magnetoresistance effect elements as shown in Table 1 were fabricated in accordance with the following procedures.

The interior of the chamber 11 was evacuated to a vacuum degree of $4 \times 10^{-7}$ Torr, Ar gas 24 (purity:99.99%) was supplied to the ion gun 23 until the partial pressure reached $1.5 \times 10^{-4}$ Torr, and Ar was ionized and radiated to targets 21 as an ion beam having an acceleration voltage of 700 V and a beam current of 30 mA. The targets 21 included three types, i.e., a target made of Co as a magnetic metal to constitute the magnetic layer of the multilayer that exhibited the magnetoresistance effect, a target made of Cu as a nonmagnetic metal to constitute the nonmagnetic layer, and a target made of an 80 wt % Ni 20 wt % Fe alloy (to be referred to as Permalloy hereinafter) as a magnetic metal to constitute the reversal assist magnetic layer. The target holder 20 was switchingly rotated every predetermined period of time. The film thickness of Cu was set to 1 nm, the film thickness of Cu was set to 1.1 nm, the number of repetition times of the Co and Cu layers was set to 60, and the film thickness of the Permalloy layer was changed in the range of 2.5 nm to 50 nm. Single-crystal MgO (110) was used as the material of the substrate 15, and the substrate temperature was set to room temperature. In addition to sample Nos. 1 to 10, a sample of Comparative Example 1 in which a Permalloy layer as the reversal assist layer was not formed was fabricated in this manner.

TABLE 1

| | Film Structure |
|---|---|
| Sample No. | |
| 1 | 2.5 nm Permalloy/(1 nm Co/1.1 nm Cu)$_{60}$/MgO |
| 2 | 5 nm Permalloy/(1 nm Co/1.1 nm Cu)$_{60}$MgO |
| 3 | 10 nm Permalloy/(1 nm Co/1.1 nm Cu)$_{60}$/MgO |
| 4 | 30 nm Permalloy/(1 nm Co/1.1 nm Cu)$_{60}$/MgO |
| 5 | 50 nm Permalloy/(1 nm Co/1.1 nm Cu)$_{60}$/MgO |
| 6 | 5 nm Permalloy/(1 nm Cu/1.1 nm Co)$_{60}$/MgO |
| 7 | 5 nm Permalloy/1 nm Co/(1.1 nm Cu/ 1.1 nm Co)$_{60}$MgO |
| 8 | (1 nm Co/1.1 nm Cu)$_{60}$/2.5 nm Permalloy/MgO |
| 9 | (1.1 nm Cu/1 nm Co)$_{60}$2.5 nm Permalloy/MgO |
| 10 | 5 nm Permalloy/1 nm Co/(1.1 nm Cu/1 nm Co)$_{60}$/ 2.5 nm Permalloy/MgO |
| Comparative Example 1 | 1(1.1 nm Cu/1 nm Co)$_{60}$/MgO |

The magnetoresistance effects of the magnetoresistance effect elements fabricated in the above manner with respect to the external magnetic field were measured in accordance with the ordinary four point method.

FIG. 12 shows the relationship between the external magnetic field (H) and the magnetoresistance ratio ($\Delta R/Rs$) of Comparative Example 1 and sample No. 2. It is seen from FIG. 12 that, in Comparative Example 1 wherein no reversal assist layer is formed, the magnetoresistance ratio ($\Delta R/Rs$) is 35% and the saturation field ($H_S$) is 6 kOe, whereas in sample No. 2, although the magnetoresistance ratio ($\Delta R/Rs$) is 35% without any change, the saturation field ($H_S$) is largely decreased to 1 kOe. In this manner, it was confirmed that the magnetoresistance effect element exhibited a better magnetoresistance effect by providing a reversal assist layer.

The same measurements as that described above were conducted for the samples of other examples, and results similar to that of sample No. 2 were obtained.

Furthermore, samples were fabricated by changing the materials constituting the magnetic and nonmagnetic layers of the multilayers and their thicknesses, and their magnetoresistance effects and saturation fields were measured. Similar effects to that of sample No. 2 were obtained.

EXAMPLE 2

Using a 79 wt % Ni 16 wt % Fe 5 wt % Mo alloy (to be referred to as the Supermalloy hereinafter) as the soft magnetic material to constitute the reversal assist layer, using a 1-nm thick $Co_{0.9}Fe_{0.1}$ alloy (to be referred to as the Co9Fe hereinafter) as the magnetic layer of the multilayer having the magnetoresistance effect, using a 1.1-nm thick Cu film as the nonmagnetic layer, setting the number of repetition times of the Co9Fe alloy layer and the Cu layer to 60, and using single-crystal MgO (110) as the material of the substrate, magnetoresistance effect elements having the film structures as shown in Table 2 were fabricated in accordance with the same method as in Example 1. In addition to sample Nos. 11 to 19, a sample of Comparative Example 2 in which a Permalloy layer as the reversal assist layer was not formed was fabricated in this manner.

TABLE 2

| Example No. | Film Structure |
|---|---|
| 11 | 2.5 nm Supermalloy/1 nm Co9Fe/(1.1 nm Cu/1 nm Co9Fe)$_{60}$/MgO |
| 12 | 5 nm Supermalloy/1 nm Co9Fe/(1.1 nm Cu/1 nm Co9Fe)$_{60}$/MgO |
| 13 | 10 nm Supermalloy/1 nm Co9Fe/(1.1 m Cu/1 nm Co9Fe)$_{60}$/Mgo |
| 14 | 30 nm Supermalloy/1 nm Co9Fe/(1.1 nm Cu/1 nm Co9Fe)$_{60}$/MgO |
| 15 | 50 nm Supermalloy/1 nm Co9Fe/(1.1 nm Cu/1 nm Co9Fe)$_{60}$MgO |
| 16 | 5 nm Supermalloy/1 nm Co9Fe/(1.1 nm Cu/1 nm Co9Fe)$_{60}$/2 nm Supermalloy/MgO |
| 17 | (1.1 nm Cu/1 nm Co9Fe)$_{60}$/2.5 nm Supermalloy/MgO |
| 18 | (1.1 nm Cu/1 nm Co9Fe)$_{30}$/2 nm Supermalloy/(1.1 nm Cu/1 nm Fe9Fe)$_{60}$/MgO |
| 19 | 5 nm Supermalloy/1 nm Co9Fe/(1.1 nm Cu/1 nm Co9Fe)$_{30}$/2.5 nm Supermalloy/ (1.1 nm Cu/1 nm Co9Fe)$_{60}$/MgO |
| Comparative Example 4 | 2(1.1 nm Cu/1 nm Co9Fe)$_{60}$MgO |

The influences of the magnetoresistance ratio ($\Delta R/Rs$) of the magnetoresistance effect elements fabricated in this manner with respect to the external magnetic field (H) were measured.

Figure 13:
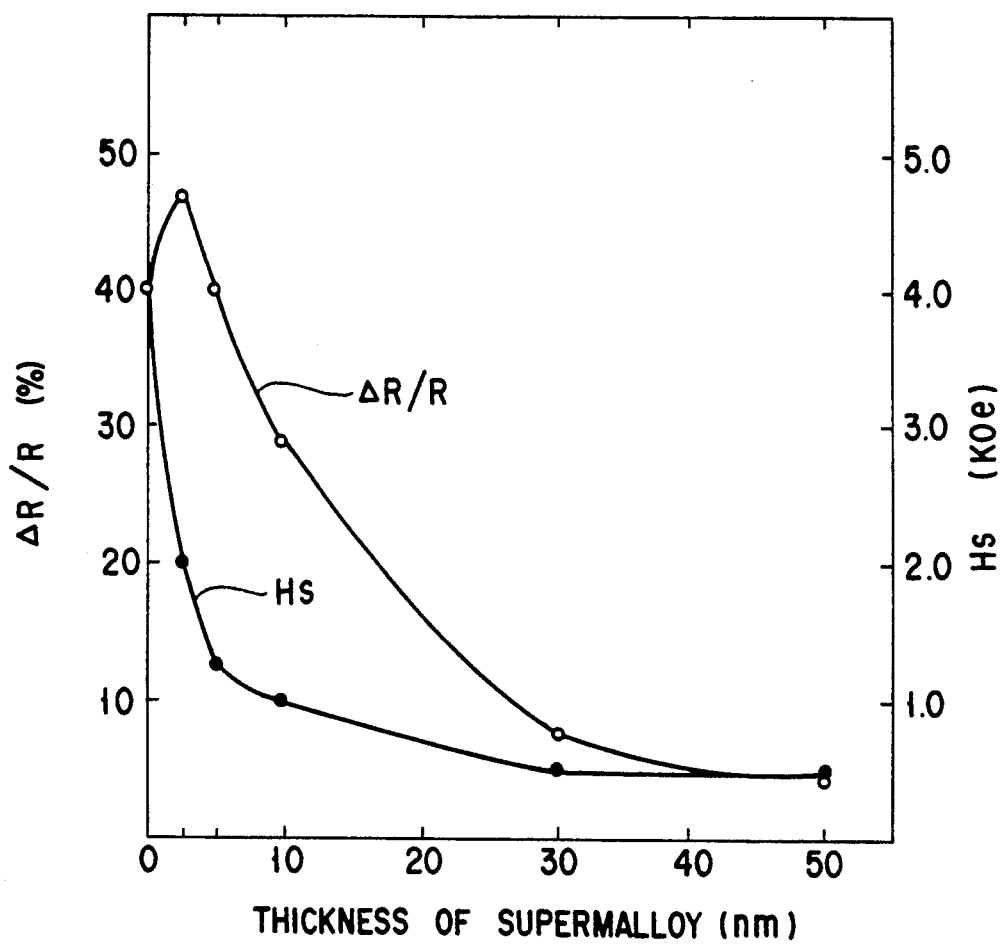
FIG. 13 is a graph showing the relationship between the thicknesses of the Supermalloy layers of Example 2 and the magnetoresistance ratio, and relationship between the thickness and the saturation fields.

FIG. 13 shows the relationship between the thickness of the Supermalloy layers of sample Nos. 11 to 15 and the magnetoresistance ratio, and the relationship between the thickness and the saturation field. It can be seen from FIG. 13 that the magnetoresistance ratio is 40% and the saturation field is 4 kOe when no Supermalloy layer is provided, whereas the magnetoresistance ratio becomes 47% and the saturation field becomes 2 kOe only by providing a 2.5-nm thick Supermalloy layer. Also, when the film thickness is increased, although the magnetoresistance ratio is gradually decreased, the saturation field is greatly decreased. In this manner, it was confirmed that a high magnetoresistance ratio was obtained with a weak magnetic field by providing a reversal assist layer made of a soft magnetic material. Similar effects were obtained for other samples measured in a similar manner.

Furthermore, as the soft magnetic layer constituting the reversal assist layer, samples using various materials, e.g., 85 at % Fe 5 at % Al 10 at % Si (Sendust), 45 at % Ni 25 at % Co 30 at % Fe (Permendur), 90 at % Co 10 at % Zr, or the like were fabricated. Their magnetoresistance effects were measured, and similar effects to that described above were obtained.

EXAMPLE 3

Using a 5-nm thick Fe film as the soft magnetic material to serve as the reversal assist layer, using a 1-nm thick Co9Fe alloy as the magnetic layer of the multilayer having the magnetoresistance effect, using a 1.1-nm thick Cu film as the nonmagnetic layer, setting the number of repetition times of the magnetic and nonmagnetic layers to 15, using single-crystal MgO (110) as the material of the substrate, and providing an Fe buffer layer between the substrate and the multilayer, magnetoresistance effect elements having the film structures as shown in Table 3 were fabricated in accordance with the same method as in Example 1. In addition to sample Nos. 21 and 22 of Example 3, a sample of Comparative Example 3 in which an Fe layer as the reversal assist layer was not formed was fabricated.

TABLE 3

| Sample No. | Film Structure |
|---|---|
| 21 | 5 nm Fe/(1 nm Co9Fe/1 nm Cu)$_{15}$/5 nm Fe/MgO |
| 22 | 5 nm Fe/1 nm Cu/(1 nm Co9Fe/1 nm Cu)$_{15}$/5 nm Fe/MgO |
| Comparative Example 3 | 1 nm Cu/(1 nm Co9Fe/1 nm Cu)$_{15}$/5 nm Fe/MgO |

The relationship between the external magnetic fields and the magnetoresistance ratios of the magnetoresistance effect elements fabricated in this manner was evaluated in the same manner as in Example 1.

Figure 14A:
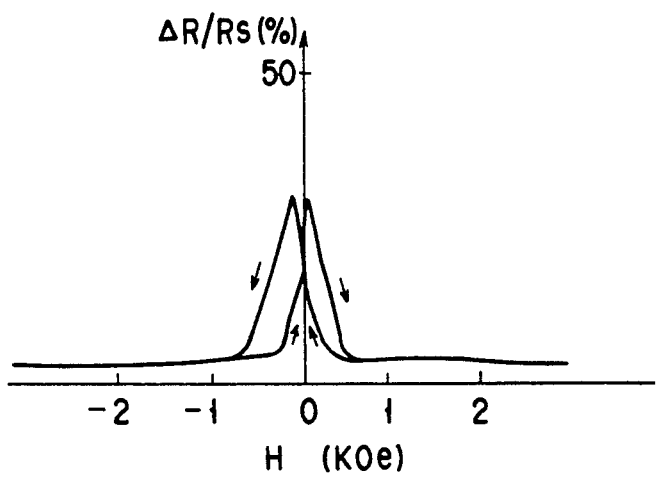
FIGS. 14A, 14B, and 14C are graphs respectively showing the relationship between the external fields and the magnetoresistance ratios of samples Nos. 21 and 22 of Example 3 and Comparative Example 2.
Figure 14B:
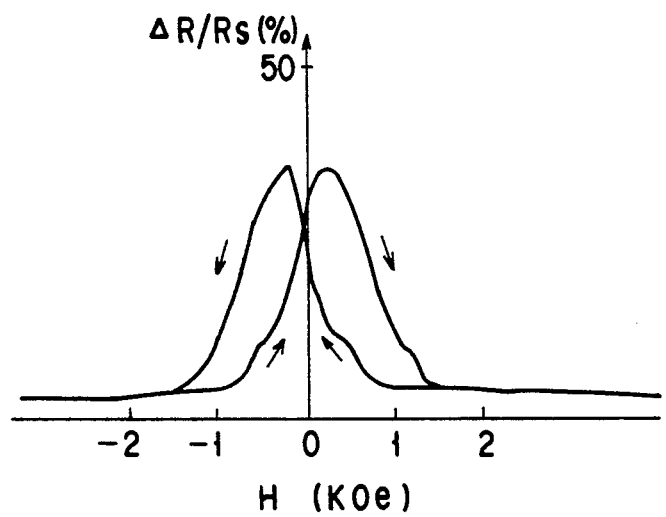
Figure 14C:
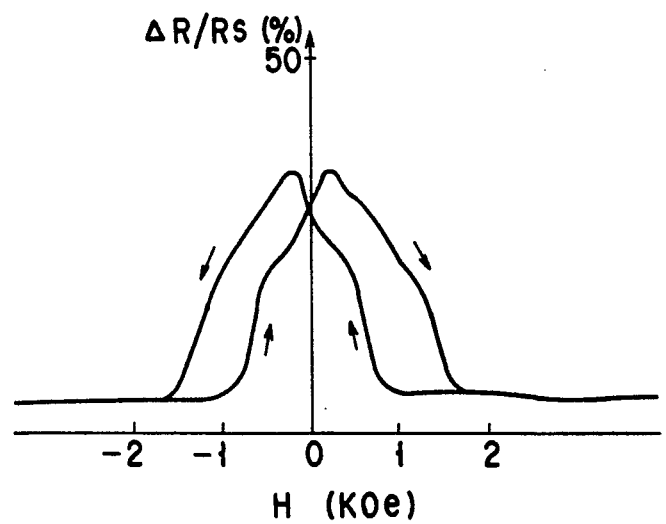

FIGS. 14A, 14B, and 14C show the influences of the magnetoresistance ratios of sample Nos. 21 and 22 and Comparative Example 3 on the external field. It can be seen from FIGS. 31A, 31B, and 31C that the respective saturation fields ($H_S$) are 700 Oe, 1.4 kOe, and 1.6 kOe indicating that the saturation field of Comparative Example 3 is increased, whereas the magnetoresistance ratios are all 30% indicating substantially no change. In this manner, it was confirmed that the saturation field could be decreased while maintaining a high magnetoresistance ratio by providing a reversal assist layer.

EXAMPLE 4

Using two 5-nm thick $Ni_{0.8}Fe_{0.2}$ films, with a 1-nm thick Cu layer interposed therebetween, as the soft magnetic layers serving as the reversal assist layers, using a 0.7-nm thick $Fe_{0.25}Co_{0.75}$ alloy as the magnetic layer and a 1-nm thick Cu film as the nonmagnetic layer, respectively, of the multilayer having the magnetoresistance effect, using single-crystal MgO (110) as the material of the substrate, and providing an Fe buffer layer between the substrate and the multilayer, magnetoresistance effect elements having the film structures as shown in Table 4 were fabricated in accordance with the same method as in Example 1. In addition to sample No. 23 of Example 4, a sample of Comparative Example 4 in which a reversal assist layer was not formed was fabricated.

TABLE 4

| | Film Structure |
|---|---|
| Sample No. 23 | (5 nm $Ni_{0.8}Fe_{0.2}$/1 nm Cu/5 nm $Ni_{0.8}Fe_{0.2}$/(0.7 nm $Fe_{0.25}Cu_{0.75}$/1 nm Cu)$_7$)$_2$/5 nm Fe/MgO |
| Comparative Example 4 | (0.7 nm $Fe_{0.25}Cu_{0.75}$/1 nm Cu)$_{16}$/5 nm Fe/MgO |

The influences of the magnetoresistance ratios of the magnetoresistance effect elements fabricated in this manner on the external magnetic field was evaluated in the same manner as in Example 1.

Figure 15:
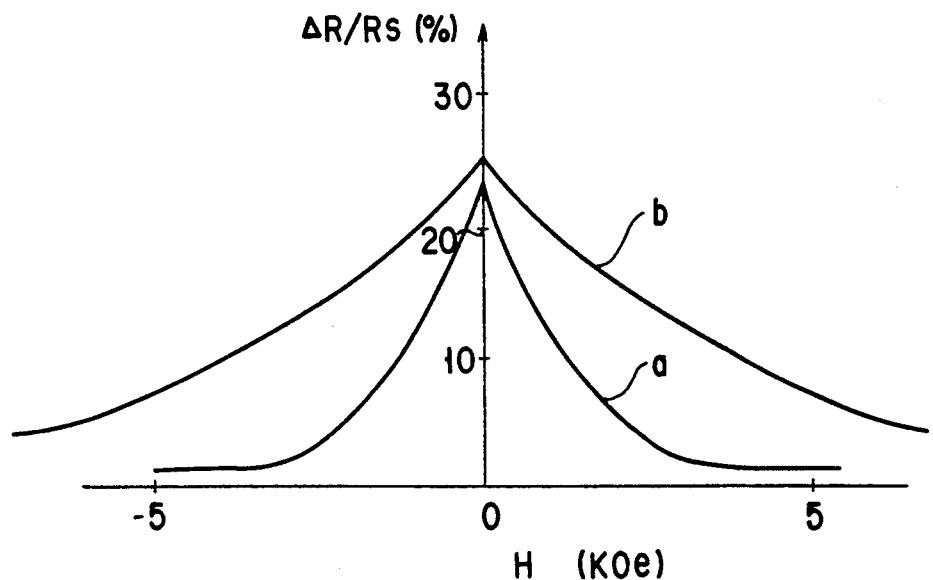
FIG. 15 is a graph showing the relationship between the external magnetic field and the magnetoresistance ratio of sample No. 23 of Example 4 and Comparative Example 4.

FIG. 15 shows the relationship between the external magnetic field and the magnetoresistance ratios of sample No. 23 of Example 4 and Comparative Example 4. Referring to FIG. 15, reference symbol a denotes sample No. 23; and b, Comparative Example 4. It can be seen from FIG. 32 that the saturation fields ($H_S$) are respectively 3 kOe and 6.5 kOe indicating that the saturation field of Comparative Example 4 is large whereas the both magnetoresistance ratios are 25% indicating substantially no change. In this manner, it was confirmed that the saturation field could be decreased while maintaining a high magnetoresistance ratio by providing a reversal assist layer.

EXAMPLE 5

Using a 4-nm thick Fe film as the soft magnetic material to serve as the reversal assist layer, using a 1.5-nm thick $Ni_{0.4}(Fe_{0.5}Co_{0.5})_{0.6}$ alloy as the magnetic layer of the multilayer having a magnetoresistance effect, using a 1-nm thick Cu film as the nonmagnetic layer, using quartz as the material of the substrate, and providing a 5-nm Fe buffer layer between the substrate ad the multilayer, magnetoresistance effect elements having the film structures as shown in Table 5 were fabricated in accordance with the same method as in Example 1. In addition to sample No. 24 as the sample of Example 5, a sample of Comparative Example 5 in which an Fe layer as the reversal assist layer was not formed was fabricated.

TABLE 5

| | Film Structure |
|---|---|
| Sample No. 24 | (4 nm Fe/(1.5 nm $Ni_{0.4}(Fe_{0.5}Co_{0.5})_{0.6}$/1 nm Cu)$_3$)$_5$/5 nm Fe/Mgo |
| Comparative Example 4 | (1.5 nm $Ni_{0.4}(Fe_{0.5}Co_{0.5})_{0.6}$/1 nm Cu)$_{16}$/5 nm Fe/MgO |

The relationship between the external magnetic field and the magnetoresistance ratio of the magnetoresistance effect elements fabricated in this manner was evaluated in the same manner as in Example 1.

Figure 16:
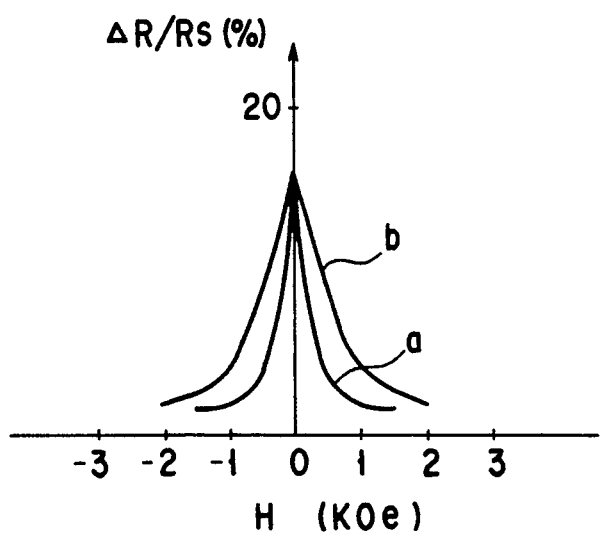
FIG. 16 is a graph showing the relationship between the external magnetic fields and the magnetoresistance ratios of sample No. 24 of Example 5 and Comparative Example 5.

FIG. 16 shows the relationship between the external magnetic fields and the magnetoresistance ratios of sample No. 24 and Comparative Example 5. In FIG. 16, reference symbol a denotes sample No. 24; and b, Comparative Example 5. It can be seen from FIG. 16 that the saturation fields ($H_S$) are respectively 0.9 kOe and 2 kOe indicating that the saturation field of Comparative Example 5 is large, whereas the respective magnetoresistance ratios are 16% indicating substantially no change. In this manner, it was confirmed that the saturation field could be decreased while maintaining a high magnetoresistance ratio by providing a reversal assist layer.

EXAMPLE 6

Using a 2.5 nm thickness Permalloy film as the soft magnetic material to scene as the reversal assist layer, using a 1 nm thickness C0.9Fe alloy as the magnetic layer of the multilayer having the magnetoresistance effect, using 1 nm thick Cu film as the nonmagnetic layer, setting the number of repetition times of the magnetic and nonmagnetic layers to 60, using single-crystal MgO (110) as the material of the substrate, magnetoresistance effect element having the film structures as shown in Table 6 were fabricated in accordance with the same method as in Example 1. In addition to sample No. 25 as the sample of Example 6, in which a Permalloy layer as the reversal assist layer was not formed was fabricated.

TABLE 6

| | Film Structure |
|---|---|
| Sample No. 25 | 2.5 nm permalloy/(1 nm Co9Fe/1 nm Cu)$_{60}$/MgO |
| Comparative Example 4 | (1 nm Co9Fe/1 nm Cu)$_{60}$/MgO |

The relationship between the external magnetic field and the magnetoresistance ratio of the magnetoresistance effect elements fabricated in this manner was evaluated in the same manner as in Example 1.

Figure 17:
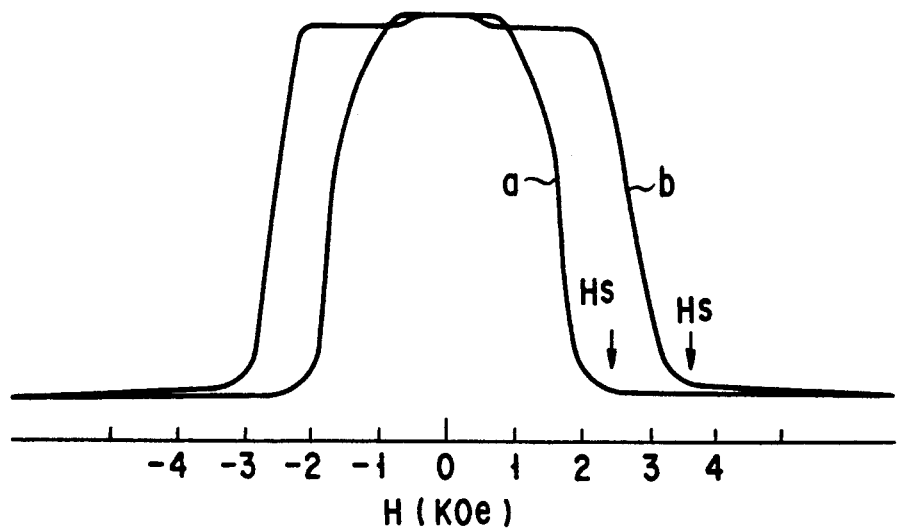
FIG. 17 is a graph showing the relationship between the external magnetic field and the magnetoresistance ratio of sample No. 25 of Example 6 and Comparative example 6.

FIG. 17 shows the relationship between the external magnetic field and the magnetoresistance ratio of the sample No. 25 and Comparative Example 6. In FIG. 17 reference symbol a denotes sample No. 25; and b, Comparative Example 6. It can be seen from FIG. 17 that the saturation fields ($H_S$) are respectively 2.4 kOe and 3.7 kOe indicating that the saturation field of Comparative Example 6 is large, whereas the magnetoresistance ratios are the same each other. In this manner, it was confirmed that the satrucation field could be decreased while maintaining a high magnetoresistance ratio by providing a reversal assist layer.

Next, changing the thickness of the Permalloy layer, the influence of the magnetoresistance ratio ($\Delta R/Rs$) of the magnetoresistance effect elements fabricated in this manner with expect to the external magnetic field (H) were measured.

Figure 18:
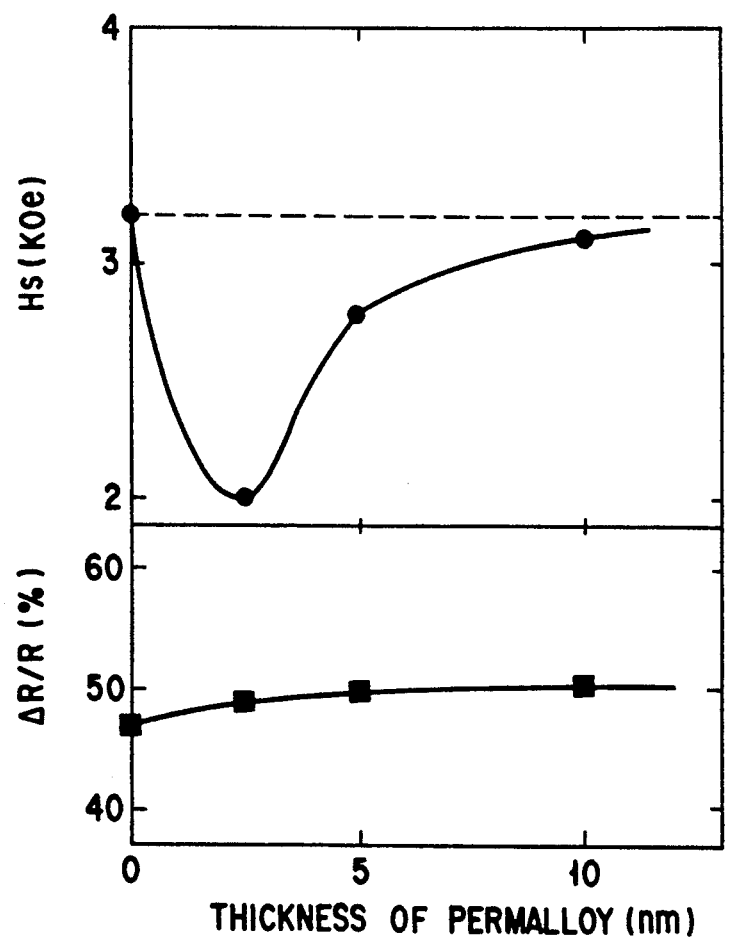
FIG. 18 is a graph showing the relationship between the thickness of the Permalloy layer as a reversal assist layer and the saturation fields, and relationship between the thickness and the magnetoresistance ratio.

FIG. 18 shows the relationship between the thickness of the Permalloy layers and the saturation field, and the relationship between the thickness and the magnetoresistance ratio.

It can be seen from FIG. 18 that the saturation field 3.2 KOe when no Permalloy layer is provide, whereas the saturation field decreases 2 KOe by providing 2.5 nm thick Permalloy layer. $\Delta R/Rs$ value is maintained 47 to 50% even if the thickness of the Permalloy layer changes. In this manner, it was confirmed that a low saturation field was obtained maintaining a high magnetoresistance ratio by providing a reversal assist layer of a soft magnetic material having suitable thickness.

EXAMPLE 7

An example in which $(Co_{0.9}Fe_{0.1}/Cu/Permalloy)_n$ multilayer was used as the MR portion and a $(Co/Cu)_n$ multilayer was used as the magnetization stabilization portion will be described below. Film deposition was performed in accordance with the ion beam sputtering apparatus shown in FIG. 7.

The interior of the chamber 11 was evacuated until a vacuum degree of $5 \times 10^{-7}$ Torr, Ar was introduced until 1×10⁻⁴ Torr, and sputtering was performed at 500 V–30 mA. As the targets 21, an $Fe_{0.1}Co_{0.9}$ alloy, a Permalloy, Co, and Cu were prepared. Quartz was used to form a substrate 15. A (25 Å $Fe_{0.1}Co_{0.9}$/30 Å Cu)$_{20}$ multilayer 21 was formed on the substrate 15, and a (10 Å Co/10 Å Cu)$_{30}$ multilayer 22 sputtered with a Cu film was formed on the multilayer 21 (see FIG. 8). The resultant structure was patterned by micropatterning to have a structure as shown in FIG. 9. This (10 Å Co/10 Å Cu)$_{30}$ multilayer was used as a second multilayer 22a serving as the magnetization stabilization portion.

The magnetoresistance effect of only the first multilayer 21 serving as the MR portion of the element which was patterned to have the structure as shown in FIG. 9 was measured. Although the magnetoresistance ratio was 12% indicating no change, the saturation field was decreased to 50 Oe, and substantially no hysteresis was observed. This may be because generation of the magnetic walls was suppressed by the magnetization stabilization portion 22a serving as the multilayer having a strong saturation field, thus unidirectionally stabilizing magnetization of the MR portion 21. This means that a low-noise magnetoresistance effect head can be provided with this method.

The magnetoresistance effects of the (25 Å $F_{0.1}Co_{0.9}$/30 Å Cu)$_{20}$ multilayer (MR portion) and the (10 Å Co/10 Å Cu)$_{30}$ multilayer (magnetization stabilization portion) fabricated as a comparative example were measured. The magnetoresistance ratios were 12% and 2%, and the saturation fields were 150 Oe and 9 kOe.

In this manner, although the saturation field of the MR portion was considerably smaller than that of the magnetization stabilization portion, it was still excessively large to be applied to a magnetoresistance effect head. Also, the hysteresis was observed. This may be because magnetization of the MR film was partially deviated from one direction to increase the saturation field, causing the hysteresis in the MR curve.

The magnetoresistance effect element obtained in this manner can be used in a magnetoresistance head to derive a signal magnetic flux as a signal current from a magnetic recording medium 81 by a lead wire 82, as shown in FIG. 19.

EXAMPLE 8

In this example, various magnetoresistance sensor of the third embodiment are described. In the sensor shown in FIG. 10 described above, shunt bias layers 52 and 53 for applying the horizontal bias are sequentially formed on the substrate 51. The shunt bias layer 52 is a bias current layer made of Ti or the like, and the shunt bias layer 53 is a high-resistant layer made of TiN, $TiO_2$, or the like. A magnetoresistance effect layer 54 made of an NiFe alloy or the like is formed on the shunt bias layer 53. A bias applying layer 55 for applying the vertical bias magnetic field to the magnetoresistance effect layer 54 is formed on the magnetoresistance effect layer 54. A conductive layer 56 for supplying a current to the magnetoresistance effect layer 54 is partially formed on a region of the bias applying layer 55.

The bias applying layer 55 is the multilayer film structure in which magnetic and nonmagnetic layers 61 and 62 are alternately stacked and which includes at least two magnetic layers 61, as shown in above described FIG. 11. Each magnetic layer 61 is made of Co, Fe, a CoFe alloy, or the like, and each nonmagnetic layer 62 is made of Cu, Cr, or the like. The magnetic and nonmagnetic layers 61 and 62 are alternately stacked in this manner, and the magnetic layers 61 that are adjacent through one nonmagnetic layer 62 are antiferromagnetically coupled. As a result, the vertical bias magnetic field can be applied from a magnetic layer 61 of the bias applying layer 55 which is closest to the magnetoresistance effect layer 54 to the magnetoresistance effect layer 54 formed under the bias applying layer 55 as the multilayer.

Figure 20A:
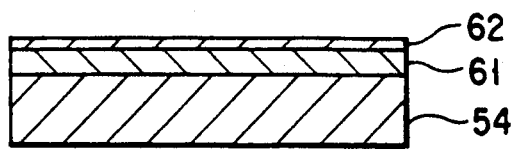
FIGS. 20A and 20B are views showing examples of a boundary portion between the magnetoresistance effect layer and the bias applying layer.
Figure 20B:
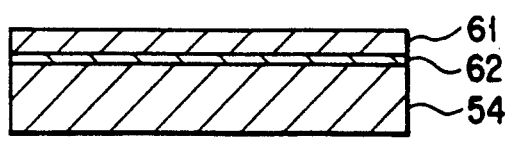

In the interface of the magnetoresistance effect layer 54 and the bias applying layer 55, the magnetic layer 61 of the bias applying layer 55 contacts the magnetoresistance effect layer 54, as shown in FIG. 20A, or the nonmagnetic layer 62 of the bias applying layer 55 contacts the magnetoresistance effect layer 54, as shown in FIG. 20B. When the crystal structures of the magnetoresistance effect layer 54 and the magnetic layers 61 are different (e.g., when an NiFe film is used as the magnetoresistance effect layer 54 and Fe films are used as the magnetic layers 61), if the nonmagnetic layer 62 and the magnetoresistance effect layer 54 contact each other, magnetic coupling between the magnetic layers 61 and the magnetoresistance effect layer 54 is weakened. Therefore, the structure of FIG. 20A in which the magnetoresistance effect layer 54 and the magnetic layer 61 contact each other is preferable.

The saturation field H$_S$ and the exchange-coupling energy J can be controlled by changing the thicknesses of the nonmagnetic layers 62 of the bias applying layer 55. For example, FIG. 13 shows changes in saturation field H$_S$ and exchange-coupling energy J obtained by changing the thicknesses of nonmagnetic layers 62 in a bias applying layer 55 having structure of using Co as the material of the magnetic layers 61 and Cu as the material of the nonmagnetic layers 62, wherein the numbers of magnetic and nonmagnetic layers 61 and 62 having a unit film thickness of 1.8 nm are respectively set to eight. The exchange-coupling energy J can be obtained from the saturation field H$_S$ of the bias applying layer 55 measured from the magnetization curve in accordance with the following equation (1):

$$H_S = 4 \cdot J/(d \cdot M_S) \qquad (1)$$

where Ms is the saturation magnetization of each magnetic layer 61 and d is the thickness of each magnetic layer.

Figure 21:
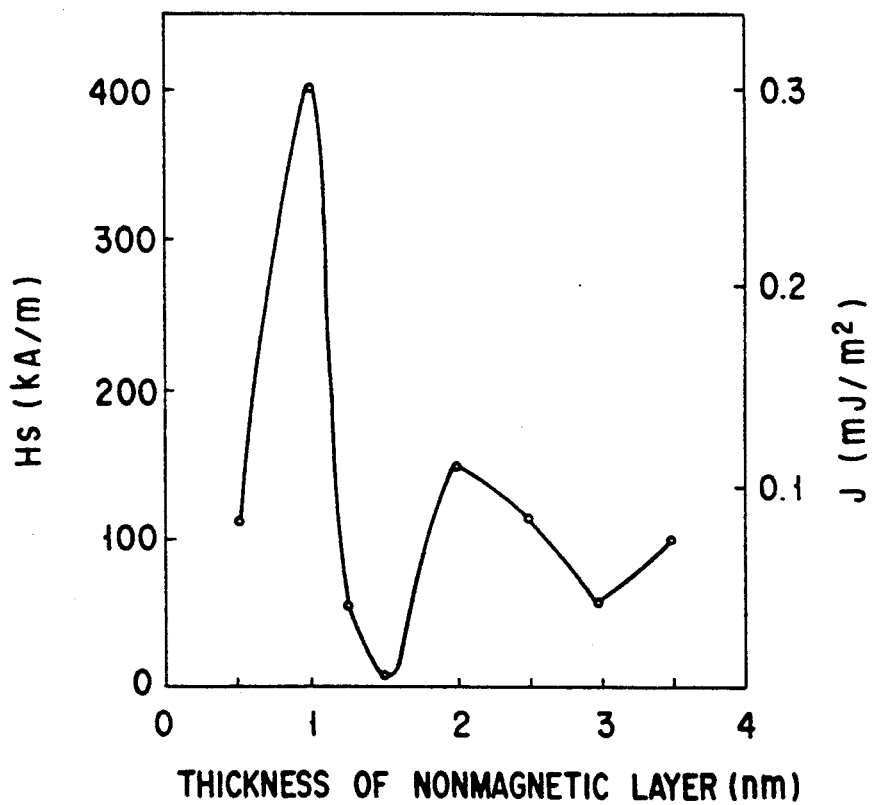
FIG. 21 is a graph showing a change in saturation field $H_S$ and a change in exchange-coupling energy J when the thickness of the nonmagnetic layer is changed.

As is apparent from FIG. 21, the exchange-coupling energy (exchange-coupling force), i.e., the bias magnetic field to be applied to the magnetoresistance effect layer 54 can be controlled by adjusting the thickness of each nonmagnetic layer 62. Furthermore, the exchange-coupling force can be adjusted by changing the material of each nonmagnetic layer 62. Table 1 shows examples of the exchange-coupling force. Table 1 shows the relationship between the types of the nonmagnetic layers 62 of the bias applying layer 55 having the structure of a thickness of 1.8 nm and the exchange-coupling energy J. Note that the thickness of each nonmagnetic layer 62 is set to a value with which a maximum J can be obtained by using the corresponding material.

TABLE 7

| Type of Nonmagnetic Layer | Exchange-Coupling Energy ($\mu J/m^2$) |
|---|---|
| Cu | 300 |
| Cr | 200 |
| V | 140 |
| Mo | 52 |

TABLE 7-continued

| Type of Nonmagnetic Layer | Exchange-Coupling Energy ($\mu J/m^2$) |
|---|---|
| W | 15 |
| Ta | 9 |
| Nb | 30 |
| Re | 120 |
| Ru | 700 |
| Rh | 1500 |

As can be seen from Table 1, the value of J can be controlled with a wide range of 9 to 1,500 $\mu J/m^2$ by changing the material of the nonmagnetic layer.

It is preferable that the saturation field $H_S$ is increased as much as possible in order to prevent degradation of the bias applying layer 55 caused by the magnetic field applied by a magnetic recording medium or the like. However, as can be seen from equation (1), since the saturation field $H_S$ is proportional to the exchange-coupling energy J, when $H_S$ is increased, J is also increased accordingly to sometimes reach an excessively high value. This problem can be avoided if the thickness or the material of the nonmagnetic layer 62 of the bias applying layer 55 which is closest to the magnetoresistance effect layer 54 is adjusted to optimize the value of the bias magnetic field to be applied to the magnetoresistance effect layer 54 and independently if the thickness or the material of other nonmagnetic layers is adjusted to increase $H_S$.

The bias applying layer 55 having the structure described above can apply a bias to the magnetoresistance effect layer 54 in a predetermined direction in accordance with a method to be described below.

Assume that a magnetic anisotropy having the x direction of FIG. 10 as the easy axis of magnetization is applied to the magnetic layers of the bias applying layer. When an external magnetic field stronger than the antiferromagnetic coupling force between the magnetic layers of the bias applying layer is applied in the x direction, magnetization of the magnetic layers 61 that are antiferromagnetically coupled stably exists in the x direction even after the external magnetic field is removed. As a result, the longitudinal bias can be applied to the magnetoresistance effect layer 54 in the x direction by the antiferromagnetic coupling force between the magnetic layers 61 and the magnetoresistance effect layer 54.

Note that the magnetic anisotropy can be applied in accordance with, e.g., the following methods.

According to the first method, films using CoFe alloy films as the magnetic layers 61, the magnetic layers 61 are formed under the magnetic field, so as to apply a uniaxial magnetic anisotropy having the direction in which the magnetic field is applied as the easy axis of magnetization. The film formation temperature is preferably equal to or higher than a temperature where antiferromagnetic coupling in the artificial lattice film disappears.

According to the second method, after the artificial lattice film is formed, the resultant structure is annealed under a magnetic field of a predetermined direction regardless of whether an NiFe alloy film as the magnetoresistance effect film is formed, so as to apply the uniaxial magnetic anisotropy having the direction of the magnetic field during annealing as the easy axis of magnetization. The annealing temperature is equal to or higher than a temperature where the antiferromagnetic coupling of the artificial lattice film disappears. The magnetic field is preferably similarly applied even during cooling.

According to the third method, if a nonmagnetic layer region 57 is formed at least at one location on the central portion of a bias applying layer 55 along the tracking width, a magnetic anisotropy having the longitudinal direction of the bias applying layer 55 as the easy axis of magnetization can be applied, as shown in FIG. 22. In order to provide the nonmagnetic layer region 57, shunt bias layers 52 and 53, and a magnetoresistance effect layer 54 are sequentially formed on a substrate 51, and the bias applying layer 55 is formed on the magnetoresistance effect layer 54 by ultra-high vacuum sputtering. Subsequently, a resist is coated on the bias applying layer 55 to form a resist layer, and the resultant structure is patterned to leave the end portions of the resist layers in the longitudinal direction as the masks. The exposed bias applying layer 55, i.e., the central portion along the tracking width in the longitudinal direction is etched by ion milling.

The fourth method utilizes a crystal magnetic anisotropy. In an artificial lattice film using a Co-based magnetic film having an hcp phase, a strong magnetic anisotropy of several 100 kA/m, having the film surface direction of the artificial lattice film which is along the (100) direction of the MgO film as the easy axis of magnetization, can be applied to the artificial lattice film by using a single-crystal MgO film having the (100) plane as the vertical direction of the film surface and forming the artificial lattice film on the MgO film.

The practical example of the fourth method will be described below in detail. For example, artificial lattice films obtained by alternately stacking 1-nm thick $Co_9Fe$ films at sixty times and 1.1-nm thick Cu films are formed on the (100) plane of a single-crystal MgO substrate, and a 1-nm thick $Co_9Fe$ film is formed on the uppermost artificial lattice film, as shown in FIG. 23. Subsequently, a 10-nm thick NiFe (Permalloy) film is formed on the resultant structure in accordance with ion beam sputtering.

Figure 24A:
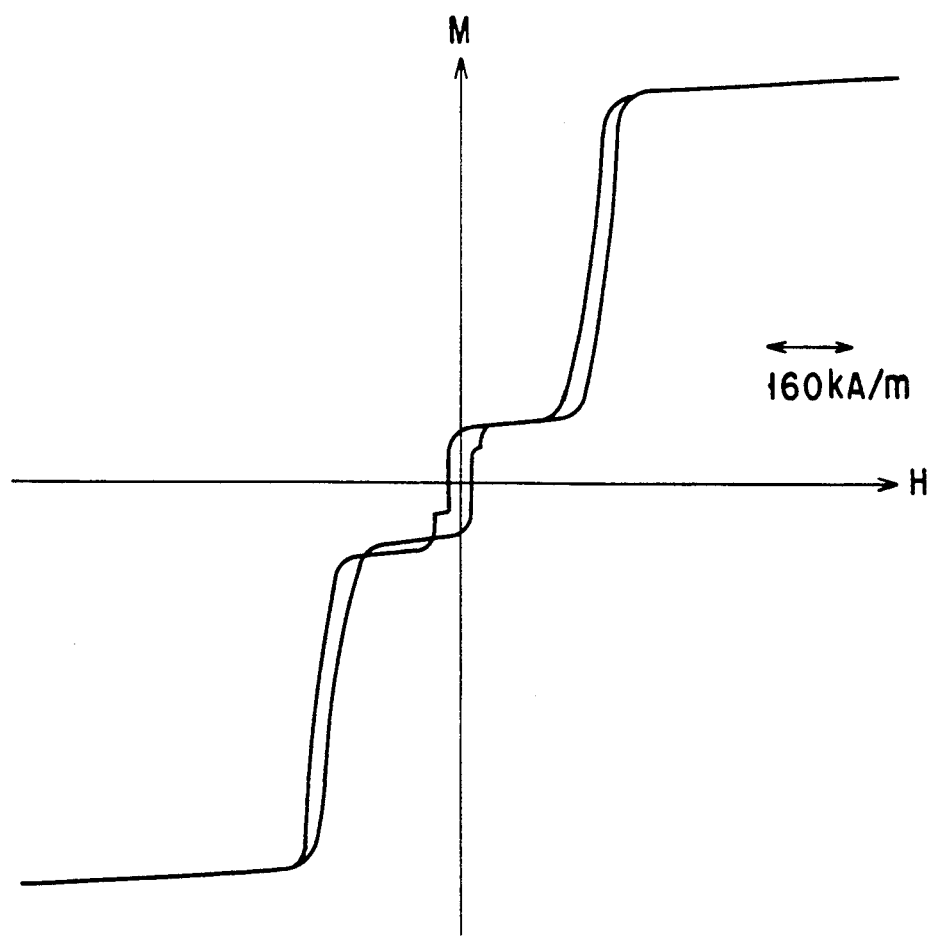
FIG. 24A is a graph showing a magnetization curve of the magnetoresistance effect sensor shown in FIG. 15 obtained by measurement in the (100)-axial direction of the MgO substrate.
Figure 24B:
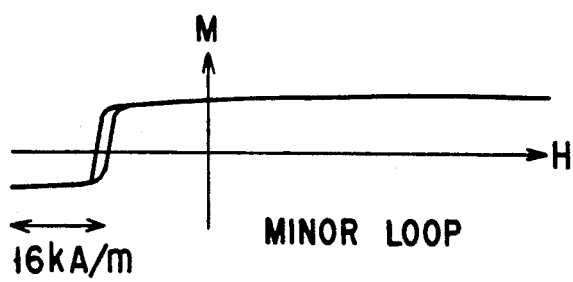
FIG. 24B shows a minor loop near the origin of FIG. 24A.

FIGS. 24A, 24B, and 25 are graphs of the magnetization of this sample measured by a vibration type magnetometer, in which FIGS. 24A and 24B are graphs obtained by measuring the magnetization in the (100)-axis direction of the MgO substrate, and FIG. 17 is a graph obtained by measuring the magnetization in the (110)-axis direction of the same. In FIG. 24A, the magnetization curve of the NiFe film is shown near the origin. FIG. 24B shows the minor loop near the origin. It is seen from FIG. 24B that a bias magnetic field of about 20 kA/m is applied to the NiFe film.

In FIG. 25, the magnetization continuously changes with respect to the applied magnetic field corresponding to the signal magnetic field, and no hysteresis is observed in the magnetization curve. Hence, it is seen that Barkhausen noise which accompanies when the magnetic walls are moved is suppressed. From these respects, it is confirmed that in this system the (100)-axis direction of the MgO substrate is the easy axis of magnetization and the (110)-axis direction is the difficult axis of magnetization. The saturation magnetic field along the difficult axis of magnetization is about $1 \times 10^3$ kA/m (point A in FIG. 17).

In this system, a bias magnetic field having the (100)-axis direction of the MgO substrate as the easy axis of magnetization was observed even if the thickness of the NiFe film and the number of artificial lattice films were changed. FIG. 26 is a graph showing the relationship between the NiFe film thickness and the characteristics of the bias magnetic field obtained when the numbers of multilayers are 60 and 15. It was confirmed from FIG. 26 that the substantially same bias magnetic field could be obtained even by setting the number of artificial lattice films to 15. It was also confirmed that the bias magnetic field was diminished as the thickness of the NiFe film was increased.

Therefore, according to the magnetoresistance effect sensor of this example, a stable longitudinal bias can be applied to the magnetoresistance effect layer 54, and Barkhausen noise caused by the instability of the magnetization behavior can be sufficiently suppressed. Since the vertical bias can be controlled by changing the thickness of the nonmagnetic layers or the types of the material, a vertical bias of a level appropriate to the specifications of the magnetoresistance effect sensor can be applied, thereby preventing the longitudinal bias from adversely affecting the sensor sensitivity. Therefore, a magnetic head capable of reproducing a signal having a high S/N ratio can be fabricated by using the magnetoresistance effect sensor of this embodiment.

FIG. 27A shows a magnetoresistance effect sensor in which bias applying layers 101 as the artificial lattice films are formed only on the regions at the two end portions of an magnetoresistance effect layer, and conductive layers 103 are formed on the bias applying layers 101. In this structure, since the longitudinal bias magnetic field of the bias applying layers 101 does not easily influence a signal magnetic field sensitive portion 102, the longitudinal magnetic field need not be strictly adjusted, which is preferable. Regarding the conductive layers, they need not be formed on the bias applying layers, but conductive layers 104 may be formed on the inner sides of the bias applying layers 101, as shown in FIG. 27B.

In the magnetoresistance effect sensor of this embodiment, in place of the conventional magnetic insulating layer, two magnetoresistance effect layers may be formed on the substrate with a bias applying layer as the artificial lattice film intervened between them, as shown in FIG. 28, and the magnetic field generated by the sense current can be used as the transverse bias. The magnetoresistance effect sensor of this type is formed by forming a magnetoresistance effect layer 111 on a substrate 51 by sputtering or vacuum deposition, forming a bias applying layer 55 as the artificial lattice film on the magnetoresistance effect layer 111 by ultra-high vacuum sputtering, forming a magnetoresistance effect layer 112 on the bias applying layer 55 in the same manner as the magnetoresistance effect layer 111, and forming a conductive layer 56 as a lead wire. At this time, if the conductive layer 56 is formed by micropatterning in accordance with ion milling, the magnetoresistance effect layer 112 can be damaged. Therefore, it is preferable that the conductive layer 56 is formed by a lift-off method.

Figure 29A:
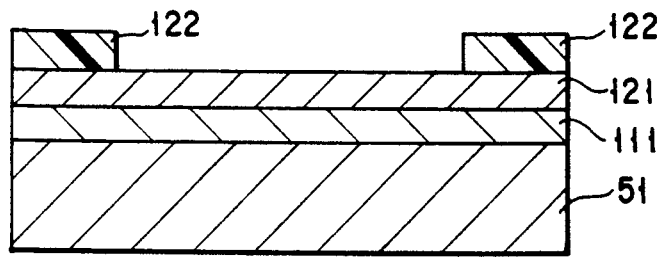
FIGS. 29A to 29D are sectional views for explaining the steps of forming a magnetically insulating layer between artificial lattice films.
Figure 29B:
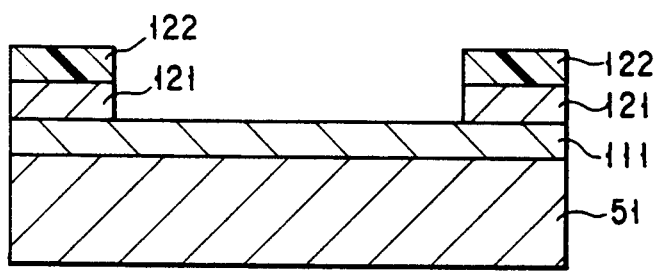
Figure 29C:
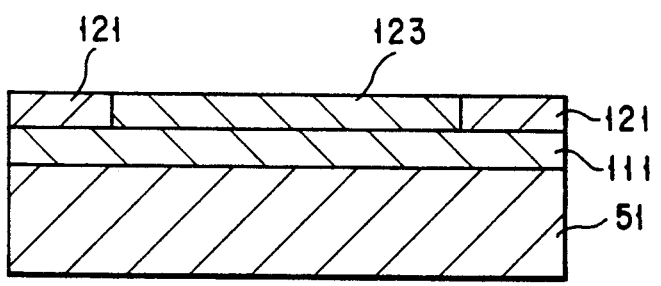
Figure 29D:
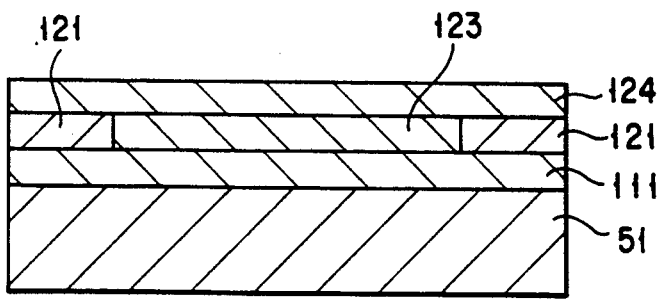

In the above structure, artificial lattice films may be formed only at regions on the two end portions of the magnetoresistance effect layer, and a magnetically insulating layer may be formed between the two artificial lattice films. In this case, a magnetoresistance effect layer 111 and a bias applying layer 121 as the artificial lattice film are sequentially stacked on a substrate 51, a resist is coated on the bias applying layer 121 to form a resist layer 122, and the resultant structure is patterned to leave the two end portions of the resist layer 122 as the masks, as shown in FIG. 29A. Subsequently, the exposed portion of the bias applying layer 121, i.e., the bias applying layer 121 excluding its two end portions is etched by ion milling, as shown in FIG. 29B. Subsequently, a magnetically insulating layer 123 is formed on the region between the remaining bias applying layers 121 by sputtering or vapor deposition to have the same thickness as that of the bias applying layers 121, and the resist layer 122 is removed, as shown in FIG. 29C. Note that TiTa or the like is used as the material of the magnetically insulating layer 123. Then, another magnetoresistance effect layer 124 is formed to cover the resultant bias applying layers 121 as the artificial lattice films and the magnetically insulating layer 123, as shown in FIG. 29D.

The magnetoresistance effect sensor of third embodiment can be applied to a magnetic head having a high sensitivity with respect to in-phase signals if an electrically insulating layer is formed between two artificial lattice films and if two magnetoresistance effect layers are formed such that the sense currents flowing therein are opposite to each other with respect to a signal magnetic field.

Figure 30A:
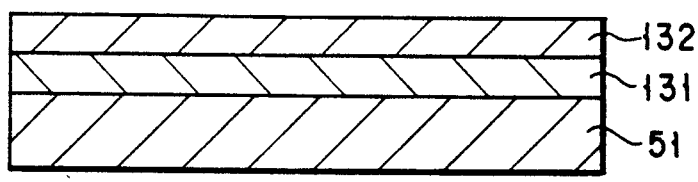
FIGS. 30A to 30D are sectional views for explaining the steps of fabricating a magnetoresistance effect sensor in which the sense currents in two magnetoresistance effect layers are set opposite to the signal currents.
Figure 30B:
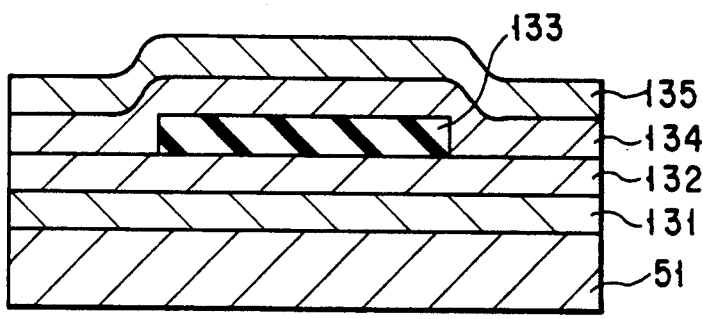

A magnetoresistance effect layer 131 and a bias applying layer 132 as the artificial lattice film are sequentially formed on a substrate 51, as shown in FIG. 30A. Subsequently, an electrically insulating layer 133 is formed on the bias applying layer 132 by a lift-off method, and another bias applying layer 134 as the artificial lattice film and a magnetoresistance effect layer 135 are sequentially formed, as shown in FIG. 30B.

Figure 30C:
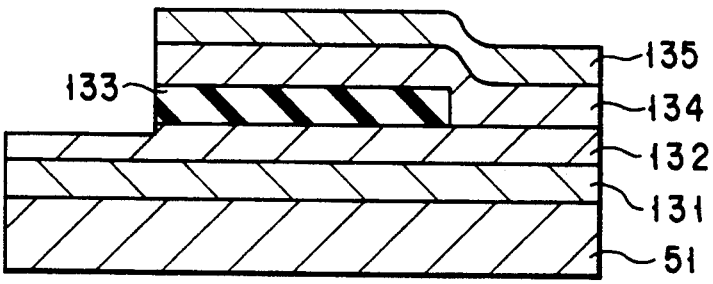

Note that $SiO_2$ or the like can be used as the material of the electrically insulating layer 133. At this time, the magnetoresistance effect layers 131 and 135 are formed by sputtering or vapor deposition, and the bias applying layers 132 and 134 as the artificial lattice films are formed by ultra-high vacuum sputtering. Then, only one side of the resultant structure is etched by ion milling down to a mid point of the bias applying layer 132 (it suffices if this point is below the upper end portion of the electrically insulating layer 133 and above the lower end portion of the magnetoresistance effect layer 131), as shown in FIG. 30C. Subsequently, a conductive layer 136 is formed as the lead wire by patterning, as shown in FIG. 30D.

Figure 30D:
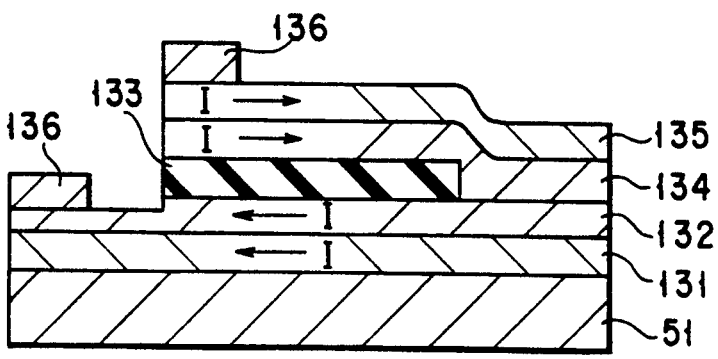

In this structure, since the directions of sense currents I in the magnetoresistance effect layers 131 and 135 can be set opposite to each other with respect to the signal magnetic field, as indicated by a reference symbol I in FIG. 30D, and since the magnetoresistance effect layers 131 and 135 are connected in series, the sensitivity of the magnetic head is improved.

Figure 31:
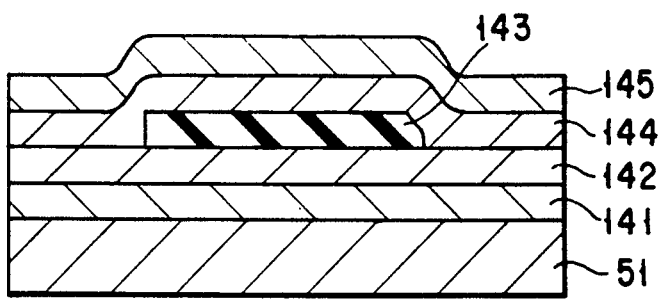
FIGS. 31 to 33 are views showing still other arrangements of the magnetoresistance effect sensor according to the third embodiment of the present invention.

The order of the magnetoresistance effect layer 131 and the bias applying layer 132, and the order of the magnetoresistance effect layer 135 and the bias applying layer 134 may be reversed so that the magnetoresistance effect layers 131 and 135 are formed inside the bias applying layers 132 an 134. A bias applying layer 134 is not sometimes correctly formed on an end portion of an electrically insulating layer 143. This problem can be solved by providing a tapered portion on the end portion of the electrically insulating layer 143 by the lift-off method during formation of the electrically insulating layer 143, as shown in FIG. 31.

Figure 32:
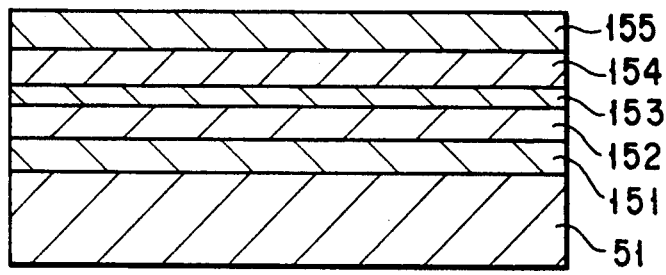

The basic structure of the magnetoresistance effect sensor according to the third embodiment is shown in FIG. 28. However, the basic structure is not limited to this. For example, a bias applying layer 151 as the artificial lattice film, a magnetoresistance effect layer 152, a magnetically insulating layer 153, a magnetoresistance effect layer 154, and a bias applying layer 155 as the artificial lattice film can be sequentially formed on a substrate 51, as shown in FIG. 32. With this structure, the distance between the magnetoresistance effect layers 152 and 154 can be further decreased. Then, both the magnetoresistance effect layers 152 and 154 apply the bias magnetic fields to each other to enhance the effect of applying the longitudinal bias.

Figure 33:
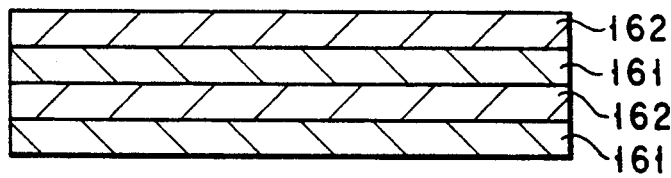

The effect of the present invention can be obtained even if magnetoresistance effect layers 161 and bias applying layers 162 as the artificial lattice films are alternately stacked, as shown in FIG. 33.

Figure 34A:
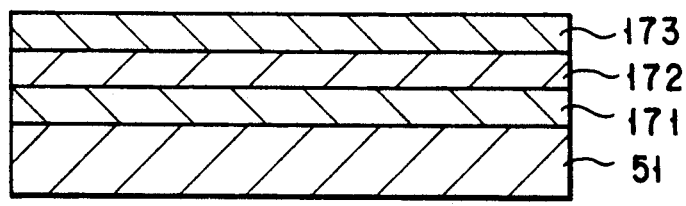
FIGS. 34A and 34B show a magnetoresistance effect sensor in which the horizontal bias is applied in accordance with the soft adjacent layer scheme.
Figure 34B:
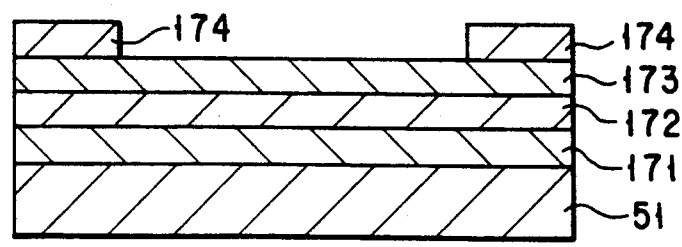

In the magnetoresistance effect sensor according to this embodiment, the horizontal bias can be applied to a magnetoresistance effect layer in the direction of a soft adjacent layer. In this case, a soft magnetic film 171 is formed on a substrate 51 by sputtering, a bias applying layer 172 as the artificial lattice film is formed on the soft magnetic film 171 by ultra-high vacuum sputtering, and a magnetoresistance effect layer 173 is formed on the bias applying layer 172 by sputtering or vacuum deposition, as shown in FIG. 34A. Subsequently, a conductive layer 174 is formed as a lead wire at a desired position of the magnetoresistance effect layer 173, as shown in FIG. 34B. At this time, the conductive layer 174 is preferably formed by the lift-off method, as described above.

With this structure, magnetization of the magnetoresistance effect layer 173 and that of the soft magnetic film 171 can be stabilized by their antiferromagnetic coupling with the bias applying layer 172. Then, Barkhausen noise of the magnetoresistance effect layer 173 and that of the soft magnetic film 171 can be suppressed.

Even if a bias applying layer 181 as the artificial lattice film, a magnetoresistance effect layer 182, a magnetically insulating layer 183, a soft magnetic film 184, and a bias applying layer 185 as the artificial lattice film are sequentially formed, as shown in FIG. 35, or even if a magnetoresistance effect layer 191 and a soft magnetic film 192 are respectively alternated with bias applying layers 193 and 194 as the artificial lattice films, as shown in FIG. 36, based on the structure of FIGS. 26A and 26B, the effect of this example.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A magnetoresistance effect element comprising:
    a multilayer obtained by stacking magnetic and nonmagnetic layers to exhibit a magnetoresistance effect; and
    a reversal assist layers, formed in contact with said multilayer, to assist reversal of a magnetic moment of said magnetic layer.

2. An element according to claim 1, wherein said reversal assist layer has a softer magnetism than that of said multilayer.

3. An element according to claim 1, wherein said reversal assist layer has a film thickness larger than that of said magnetic layers of said multilayer.

4. An element according to claim 1, wherein said magnetic layers of said multilayer contain Fe, Co, Ni, or an alloy containing Fe, Co, or Ni.

5. An element according to claim 1, wherein said nonmagnetic layer of said multilayers contain Cr, Ru, Cu, Al, Ag, Au, or an alloy containing Cr, Ru, Cu, Al, Ag, or Au.

6. An element according to claim 1, wherein said magnetic layers of said multilayer have a film thickness of 0.1 nm to 10 nm.

7. An element according to claim 1, wherein said nonmagnetic layers of said multilayer have a film thickness of 0.5 nm to 10 nm.

8. An element according to claim 1, wherein said reversal assist layer is disposed on an outerend portion of said multilayer and contacts to said magnetic layer of said multilayer.

9. An element according to claim 1, wherein said reversal assist layer is interposed between a substrate and said multilayer, and contacts to said nonmagnetic layer of said multilayer.

10. An element according to claim 1, further comprising another reversal assist layer and/or another multilayer.

11. An element according to claim 1, wherein at least one of said reversal assist layers is interposed between two of said magnetic layers, said magnetic layer and said nonmagnetic layer, or two of said nonmagnetic layers of said multilayer.

12. A magnetoresistance effect element comprising:
    a first multilayer obtained by stacking magnetic and nonmagnetic layers to exhibit a magnetoresistance effect; and
    a second multilayer obtained by stacking magnetic and nonmagnetic layers to exhibit a saturation field larger than that of said first multilayer, wherein
    said second multilayer is formed on at least an end portion of said first multilayer to apply a bias magnetic field to said first multilayer.

13. An element according to claim 12, wherein each second multilayer applies a longitudinal magnetic field to said first multilayer.

14. An element according to claim 12, wherein each of said magnetic layers of said first and second multilayers has a film thickness of 0.5 nm to 5 nm.

15. An element according to claim 12, wherein each of said nonmagnetic layer of said first multilayer and said nonmagnetic layer of said second multilayer has a film thickness of 0.5 nm to 5 nm.

16. An element according to claim 12, wherein said magnetic layer of said first and second multilayers contains Fe, Co, Ni, or an alloy containing Fe, Co, or Ni.

17. An element according to claim 12, wherein said nonmagnetic layer of said first multilayer has a film thickness larger than that of said nonmagnetic layer of said second multilayer.

18. An element according to claim 12, wherein said magnetic layer of said first multilayer has a magnetic anisotropy.

19. An element according to claim 12, wherein a ratio of the saturation field of said first multilayer to that of said second multilayer is not more than 1/5.

20. A magnetoresistance effect sensor comprising:
    a substrate;
    a magnetoresistance effect layer having a magnetoresistance effect;
    a bias applying layer which is obtained by stacking magnetic and nonmagnetic layers and in which two magnetic layers adjacent to each other with one of said nonmagnetic layers interposed therebetween are antiferromagnetically coupled to apply a bias to said magnetoresistance effect layer; and a conductive layer formed on said magnetoresistance effect layer or said bias applying layer, wherein said sensor detects a magnetic field from a change in electric resistance of said magnetoresistance effect layer.

21. A sensor according to claim 20, wherein said bias applying layer applies a longitudinal bias to said magnetoresistance effect layer.

* * * * *